(12) United States Patent
Daneman et al.

(10) Patent No.: US 9,802,815 B2
(45) Date of Patent: Oct. 31, 2017

(54) METHOD FOR MEMS STRUCTURE WITH DUAL-LEVEL STRUCTURAL LAYER AND ACOUSTIC PORT

(71) Applicant: Invensense, Inc., San Jose, CA (US)

(72) Inventors: Michael Julian Daneman, Campbell, CA (US); Mei-Lin Chan, Sunnyvale, CA (US); Martin Lim, San Mateo, CA (US); Fariboz Assaderaghi, Emerald Hills, CA (US); Erhan Polatkan Ata, Santa Clara, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 14/957,562

(22) Filed: Dec. 2, 2015

(65) Prior Publication Data

US 2016/0083247 A1 Mar. 24, 2016

Related U.S. Application Data

(62) Division of application No. 14/084,569, filed on Nov. 19, 2013, now Pat. No. 9,227,842.

(Continued)

(51) Int. Cl.
*H01L 21/33* (2006.01)
*B81C 1/00* (2006.01)

(52) U.S. Cl.
CPC ...... *B81C 1/00246* (2013.01); *B81C 1/00158* (2013.01); *B81B 2201/0257* (2013.01); *B81B 2201/0264* (2013.01); *B81B 2203/0127* (2013.01); *B81B 2207/012* (2013.01); *B81C 2201/112* (2013.01); *B81C 2203/0118* (2013.01); *B81C 2203/0742* (2013.01); *B81C 2203/0792* (2013.01); *H01L 2224/83805* (2013.01)

(58) Field of Classification Search
CPC ............ H01L 2924/1461; H01L 29/84; B81B 2201/0257; B81B 2207/012; B81B 2201/0264; B81C 2201/112
USPC .............................. 257/414–419; 438/50–53
See application file for complete search history.

(56) References Cited

U.S. PATENT DOCUMENTS

2004/0152272 A1* 8/2004 Fladre ............... H01L 21/76256
438/284
2008/0099862 A1* 5/2008 Fujii ................... B81C 1/00269
257/417

(Continued)

*Primary Examiner* — Whitney T Moore
*Assistant Examiner* — Herve Assouman
(74) *Attorney, Agent, or Firm* — Maryam Imam; Klintworth & Rozenblat IP LLP

(57) ABSTRACT

A method for fabricating a MEMS device includes depositing and patterning a first sacrificial layer onto a silicon substrate, the first sacrificial layer being partially removed leaving a first remaining oxide. Further, the method includes depositing a conductive structure layer onto the silicon substrate, the conductive structure layer making physical contact with at least a portion of the silicon substrate. Further, a second sacrificial layer is formed on top of the conductive structure layer. Patterning and etching of the silicon substrate is performed stopping at the second sacrificial layer. Additionally, the MEMS substrate is bonded to a CMOS wafer, the CMOS wafer having formed thereupon a metal layer. An electrical connection is formed between the MEMS substrate and the metal layer.

9 Claims, 29 Drawing Sheets

Related U.S. Application Data

(60) Provisional application No. 61/770,214, filed on Feb. 27, 2013.

(56) References Cited

U.S. PATENT DOCUMENTS

| | | |
|---|---|---|
| 2010/0052082 A1 | 3/2010 | Lee et al. |
| 2011/0147859 A1* | 6/2011 | Tanaka .................... B81B 7/007 257/415 |
| 2012/0001276 A1 | 1/2012 | Huang et al. |
| 2012/0001277 A1* | 1/2012 | Park .................... B81C 1/00182 257/418 |
| 2012/0043627 A1* | 2/2012 | Lin .......................... B81B 7/02 257/415 |
| 2012/0061776 A1* | 3/2012 | Cheng ................ B81C 1/00333 257/415 |
| 2012/0326248 A1 | 12/2012 | Daneman et al. |
| 2013/0001710 A1 | 1/2013 | Daneman et al. |

\* cited by examiner

METHOD FOR MEMS STRUCTURE WITH DUAL-LEVEL STRUCTURAL LAYER AND ACOUSTIC PORT

CROSS REFERENCE TO RELATED APPLICATIONS

This application is a divisional of U.S. patent application Ser. No. 14/084,569, titled "METHOD FOR MEMS STRUCTURE WITH DUAL-LEVEL STRUCTURAL LAYER AND ACOUSTIC PORT", by Daneman et al., filed on Nov. 19, 2013, which claims priority to U.S. Provisional Application No. 61/770,214, titled, "METHODS FOR MEMS STRUCTURE WITH DUAL-LEVEL STRUCTURAL LAYER AND ACOUSTIC PORT", by Daneman et al., on Feb. 27, 2013, the disclosure of which is incorporated herein by reference as though set forth in full.

BACKGROUND

Various embodiments of the invention relate generally to a MEMS device and particularly to a method for manufacturing the same.

A typical approach to manufacturing a MEMS acoustic device is to make the MEMS substrate and the CMOS substrate, the two of which form the MEMS device, in two separate chips. This causes the MEMS device to be large with undesirably high parasitic capacitances caused by the MEMS to CMOS interconnect.

What is desired is a compact CMOS-MEMS integrated acoustic device with tightly controlled MEMS structure thickness tolerances and a reliable manufacturing flow.

SUMMARY

Briefly, a method for fabricating a MEMS device includes depositing and patterning a first sacrificial layer onto a silicon substrate, the first sacrificial layer being partially removed leaving a first remaining oxide. Further, the method includes depositing a conductive structure layer onto the silicon substrate, the conductive structure layer making physical contact with at least a portion of the silicon substrate. Further, a second sacrificial layer is formed on top of the conductive structure layer. Patterning and etching of the silicon substrate is performed stopping at the second sacrificial layer. Additionally, the MEMS substrate is bonded to a CMOS wafer, the CMOS wafer having formed thereupon a metal layer. An electrical connection is formed between the MEMS substrate and the metal layer.

A further understanding of the nature and the advantages of particular embodiments disclosed herein may be realized by reference of the remaining portions of the specification and the attached drawings.

DETAILED DESCRIPTION OF EMBODIMENTS

In the described embodiments Micro-Electro-Mechanical Systems (MEMS) refers to a class of structures or devices fabricated using semiconductor-like processes and exhibiting mechanical characteristics such as the ability to move or deform. MEMS often, but not always, interact with electrical signals. MEMS devices include but are not limited to actuators, gyroscopes, accelerometers, magnetometers, pressure sensors, microphones, and radio-frequency components. Silicon wafers containing MEMS structures are referred to as MEMS wafers.

In the described embodiments, MEMS device may refer to a semiconductor device implemented as a micro-electro-mechanical system. MEMS structure may refer to any feature that may be part of a larger MEMS device. An engineered silicon-on-insulator (ESOI) wafer may refer to a SOI wafer with cavities beneath the silicon device layer or substrate. Handle wafer typically refers to a thicker substrate used as a carrier for the thinner silicon device substrate in a silicon-on-insulator wafer. Handle substrate and handle wafer can be interchanged.

In the described embodiments, a cavity may refer to an opening or recession in a substrate wafer and enclosure may refer to a fully enclosed space. Post may be a vertical structure in the cavity of the MEMS device for mechanical support. Standoff may be a vertical structure providing electrical contact.

In the described embodiments, back cavity may refer to a partially enclosed cavity equalized to ambient pressure via Pressure Equalization Channels (PEC). In some embodiments, back cavity is also referred to as back chamber. A back cavity formed in the CMOS-MEMS device can be referred to as integrated back cavity. Pressure equalization channel also referred to as leakage channels/paths are acoustic channels for low frequency or static pressure equalization of back cavity to ambient pressure.

In the described embodiments, a rigid structure within a MEMS device that moves when subject to force may be referred to as a plate. A back plate may be a perforated plate used as an electrode.

In the described embodiments, perforations refer to acoustic openings for reducing air damping in moving plates. Acoustic port may be an opening for sensing the acoustic pressure. Acoustic barrier may be a structure that prevents or delays acoustic pressure from reaching certain portions of the device. Linkage is a structure that provides compliant attachment to substrate through anchor. Extended acoustic gap can be created by step etching of post and creating a partial post overlap over PEC. In plane bump stops are extensions of the plate which come in contact with the device seal to limit range of movement in the plane of the plate. Rotational bump stop are extensions of the plate to limit range of rotations.

Figure 1A:
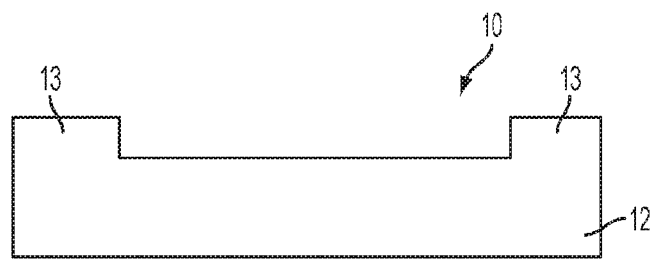
FIGS. 1A-1S show a process of fabricating a MEMS device, in accordance with a method of the invention.
Figure 1B:
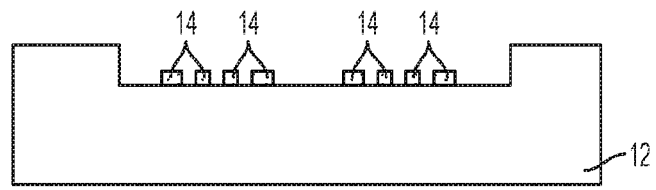
Figure 1C:
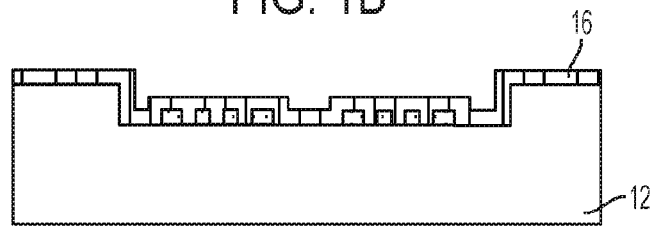
Figure 1D:
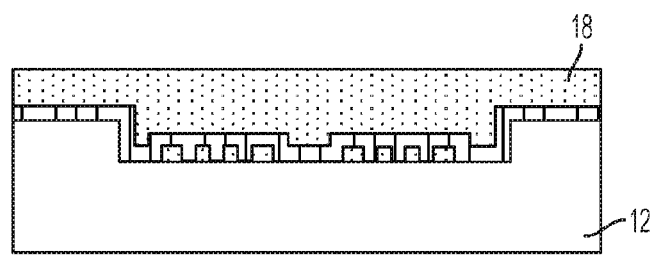
Figure 1E:
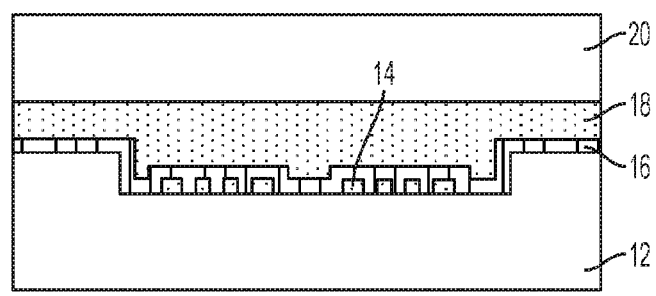
Figure 1F:
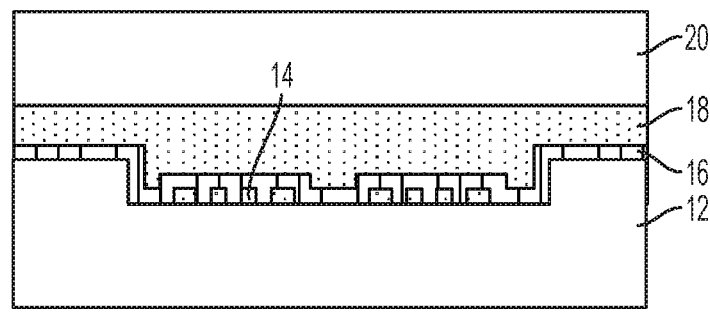
Figure 1G:
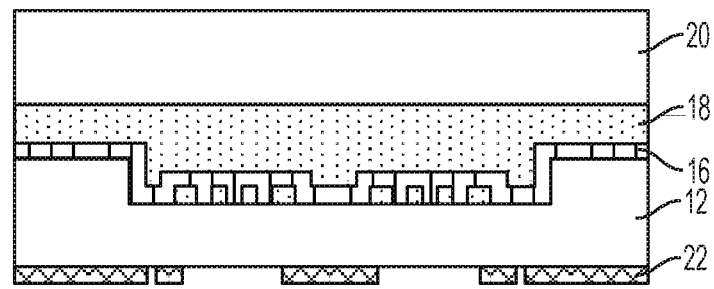
Figure 1H:
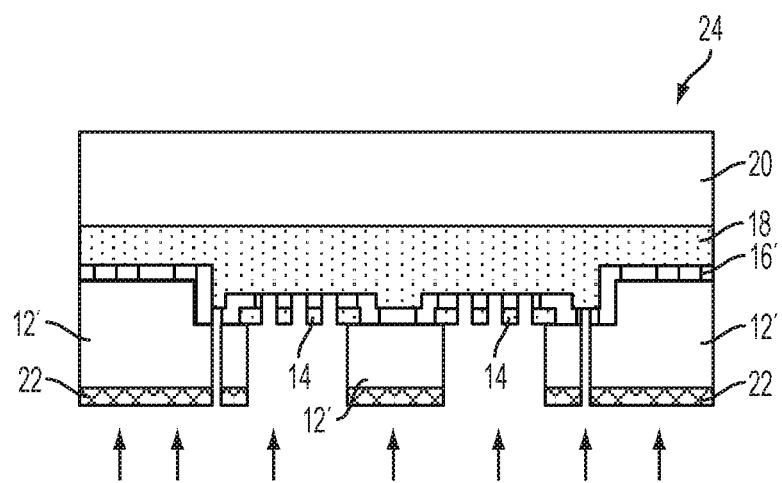
Figure 1I:
Figure 1J:
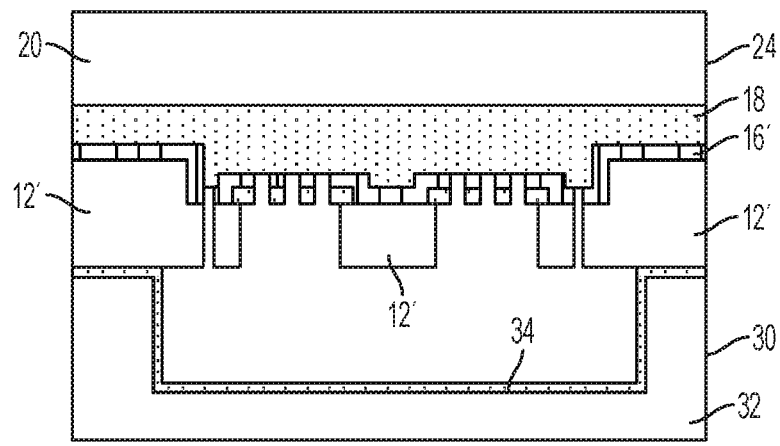
Figure 1K:
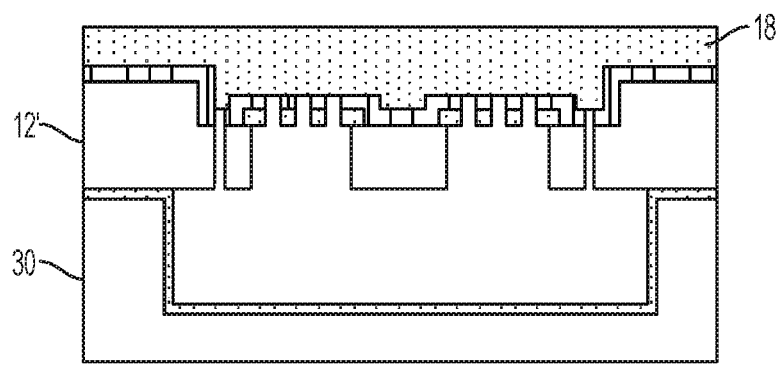
Figure 1L:
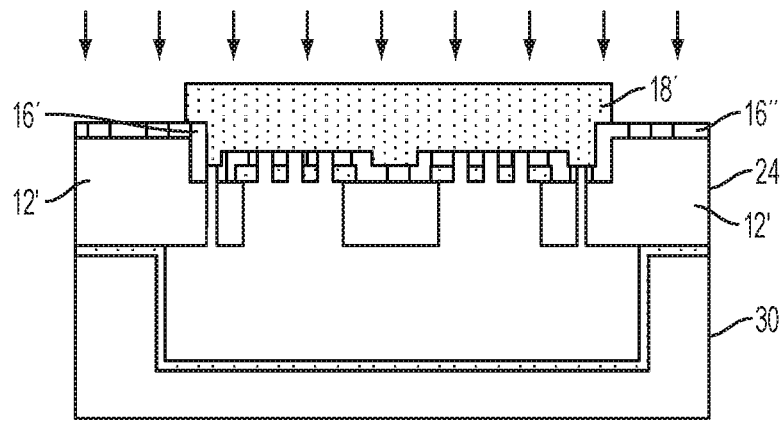
Figure 1M:
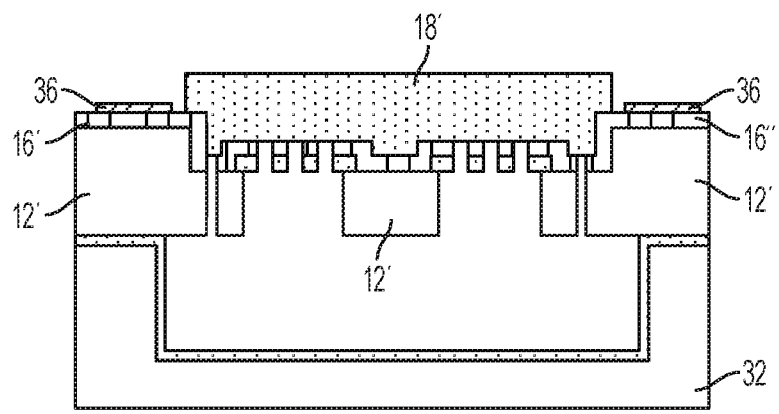
Figure 1N:
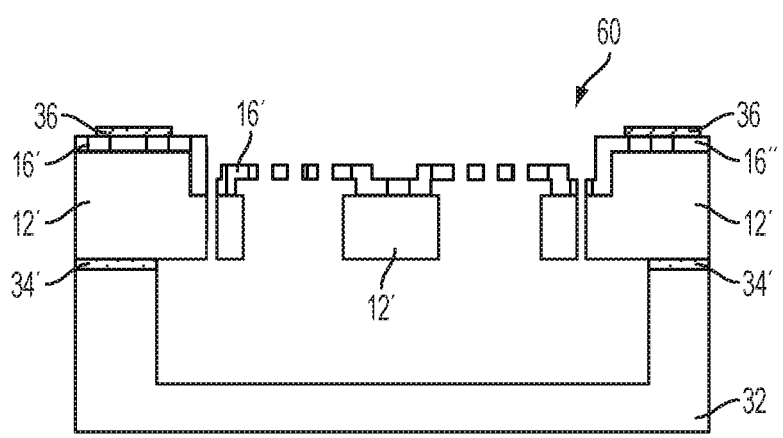
Figure 1O:
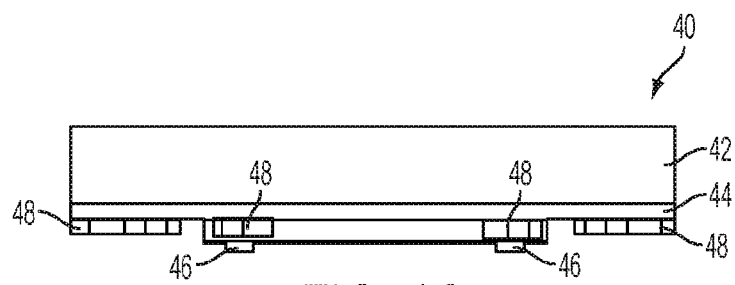
Figure 1P:
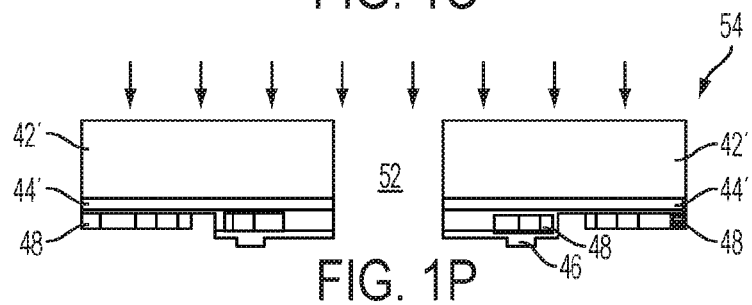
Figure 1Q:
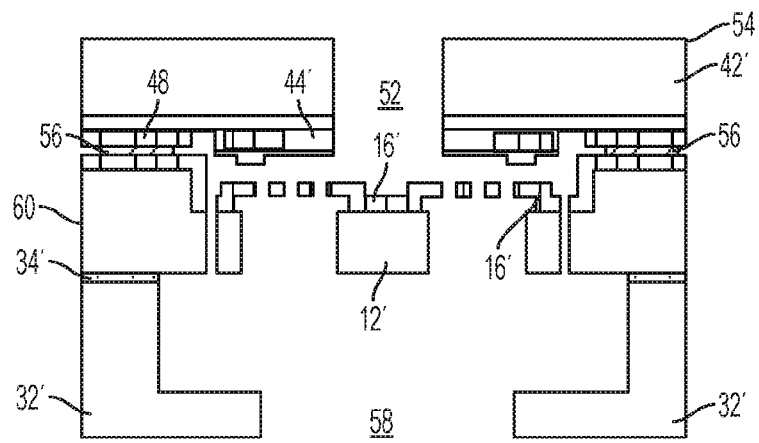
Figure 1R:
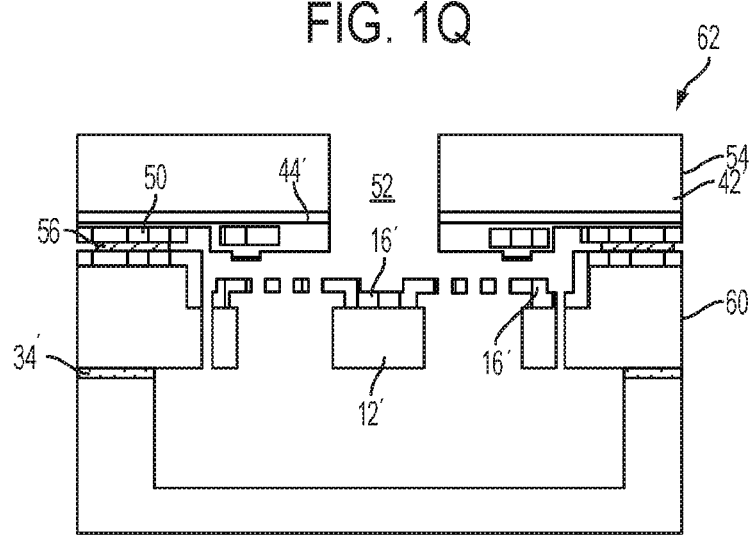
Figure 1S:
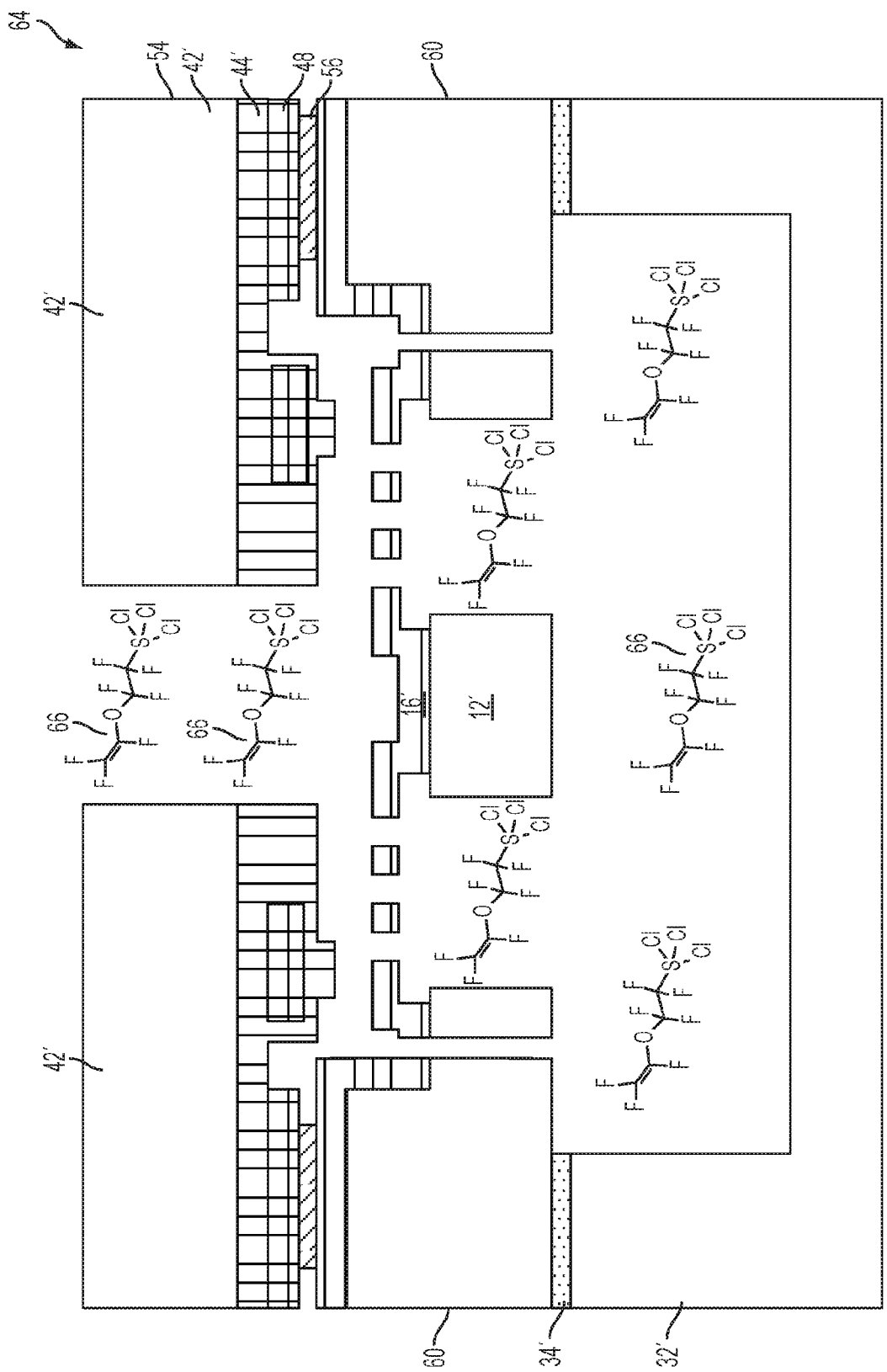

Referring now to FIGS. 1A-1S, a process of fabricating a MEMS device is shown, in accordance with a method of the invention. In FIG. 1A, the MEMS device 10 is shown to include a silicon wafer 12 on top of which are shown standoffs 13. The standoffs 13 are partially etched into the silicon wafer 12. In FIG. 1B, oxide deposition and etching is performed to form the mask for the thin portion membranes 14. This mask is made of oxide and is formed on top of the silicon wafer 12 between the standoffs 13. In FIG. 1C, polysilicon 16 is deposited on top of the silicon wafer 12, the standoffs 13, and the masks 14. In the described embodiments, poly crystalline silicon is referred to as poly silicon. The thickness of the polysilicon 16 essentially defines the thickness of the thin region of the MEMS device 10.

In FIG. 1D, silicon oxide 18 is shown to be deposited and chemical mechanical polishing (CMP) is performed to flatten the surface of the silicon oxide 18. The silicon oxide 18 assists in bonding to a temporary handle wafer as will be evident relative to FIG. 1E.

In FIG. 1E, a temporary handle wafer 20 is bonded to the silicon oxide 18. In an exemplary method of the invention, silicon oxide fusion bonding is used to bond the temporary handle wafer 20 to the silicon oxide 18. In another embodiment, a temporary polymer bond is used. In FIG. 1F, the bottom surface of the silicon wafer 12 is ground and polished to form the structure shown in FIG. 1G. Thus, at FIG. 1G, the silicon wafer 12 is thinner than it is in FIG. 1F or before the grinding. The thickness of the silicon wafer in FIG. 1G essentially defines the thickness of the thick structure of the MEMS device 10. As shown in FIG. 1G, photoresist 22 is patterned in select areas of the bottom surface of the silicon wafer 12. Such patterning of photoresist essentially protects the silicon wafer 12 from being etched in a next step, as desired.

In FIG. 1H, dry etching is performed on the photoresist 22, as shown by the arrows in FIG. 1H. In an exemplary method of the invention, deep reactive ion etching (DRIE) is chosen as the method for etching and has a higher etch rate so silicon and polysilicon than for silicon oxide. Select areas of the silicon wafer 12 are etched through the polysilicon 16 stopping at silicon oxide 18 thereby forming the silicon wafer 12' and the polysilicon 16'. After etching, the silicon oxide 18 is connected to the polysilicon 16' in areas where there is no photoresist and/or when protected by the oxide masks 14. FIG. 1H shows the MEMS substrate 24 after the completion of this etching step.

FIG. 1I shows a handle wafer 30 into which silicon is partially etched to define the cavity 33 followed by oxidation. The handle wafer 30 is shown to include a silicon (or "cap") layer 32 onto which is formed silicon dioxide layer 34 into which the cavity 33 is formed. In FIG. 1J, the MEMS substrate 24 is shown bonded to the handle wafer 30. In an exemplary method, fusion bonding is used for this process.

In FIG. 1K, the temporary handle wafer 20 is removed by mechanical grinding, etching, or a combination thereof. In an alternate embodiment where a polymer temporary bond was used to attach temporary handle wafer 20, the temporary handle wafer 20 is removed using a polymer solvent, heat, or a combination thereof. Prior to being removed, the temporary handle wafer 20 supports the foregoing thinning process while protecting silicon wafer 12' during handling.

In FIG. 1L, the silicon oxide 18 is partially etched using photolithography to expose the polysilicon 16'. The exposed polysilicon 16" along with the part of the silicon wafer 12' that is directly below it form the standoffs. It is noted that silicon oxide 18' is not entirely etched with the portions formed on top of the membrane 14 and partially on top of the polysilicon 16' remaining after the etching step of FIG. 1L.

In FIG. 1M, a conductive layer 36 is shown deposited on top of the exposed polysilicon 16". In an exemplary embodiment, the conductive layer 36 is made of germanium though other suitable material, such as but not limited to, gold, aluminum, and tin may be employed. A vapor or liquid phase hydrofluoric acid (HF) etching of silicon oxide 18' is performed and the MEMS substrate 60 of FIG. 1N is released.

FIG. 1O shows a CMOS wafer 40 including the CMOS substrate 42 onto which pattern is optionally etched on the CMOS oxide 44 to form bump stops 46. In other embodiments, any semiconductor wafer can be used. A metal layer 48 is dispersed in the CMOS oxide 44 for ultimately electrically connecting the CMOS wafer to the MEMS substrate. Bump stops 46 minimize the contact between the MEMS membrane and the CMOS wafer, minimizing both in-process and in-operation stiction.

In FIG. 1P, a port 52 is etched into the CMOS substrate 42 through the CMOS oxide 44 to form the CMOS substrate 42' and the CMOS oxide 44' respectively. The CMOS wafer 54 of FIG. 1P is optionally further etched at the handle wafer 32 to form the handle wafer 32' creating the port 58. The ports 52 and 58 are each separate cavities or acoustic ports for use in embodiments where the MEMS device 10 is a microphone. Alternatively, the port 58 is not etched or created, rather, only the port 52 is formed, as shown in FIG. 1R. The embodiment of FIG. 1R integrates the back-cavity into the device and is therefore more compact and results in a smaller device as compared to that of FIG. 1Q. However, the acoustic performance of the embodiment of FIG. 1R is typically reduced relative to that of FIG. 1Q because the back cavity of the former is smaller than the back cavity of the embodiment of FIG. 1Q. In the embodiment of FIG. 1Q, the device is larger but performance is better relative to the embodiment of FIG. 1R because the packaging of the device in FIG. 1R is used as the back cavity.

In FIG. 1S, the MEMS device 64 is shown to be antistiction coated using a hydrophobic low surface energy coating, for example long-chain fluorocarbons such fluorodecil-trichloro-silane (FDTS). The coating is typically deposited as a self-assembled monolayer (SAM) or using atomic layer deposition (ALD). One such ALD layer is aluminum oxide Al2O3. Among other benefits, this coating serves to lower the surface energy and repel water thereby preventing the surfaces of the CMOS wafer and the MEMS membrane from sticking to each other. The coating may also prevent corrosion.

FIGS. 2A-2L show a process of fabricating a MEMS device, in accordance with another method of the invention. This process is analogous to the process of FIGS. 1A-1S through the step of FIG. 1H. In forming the handle wafer, in FIG. 2a, there is no cavity etched in the handle wafer 200 of FIG. 2A. The handle wafer 200 is shown to include a silicon wafer 202 that is not partially etched and rather, has oxide 204 patterned on top of the silicon wafer 202. In other words, oxide 204 is deposited onto and selectively removed from the silicon wafer 202.

Figure 2A:
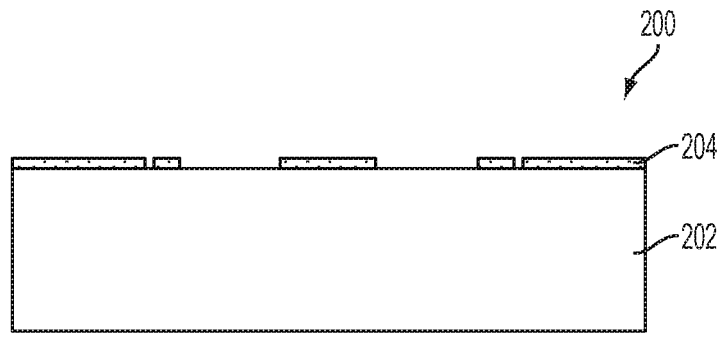
FIGS. 2A-2L show a process of fabricating a MEMS device, in accordance with another method of the invention.
Figure 2B:
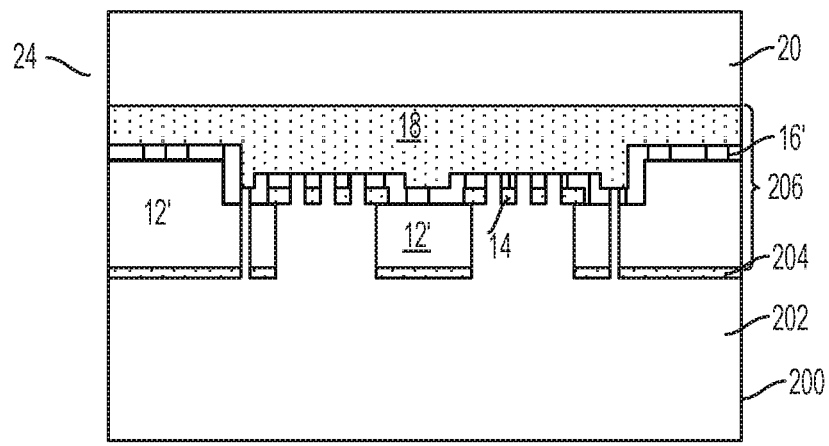
Figure 2C:
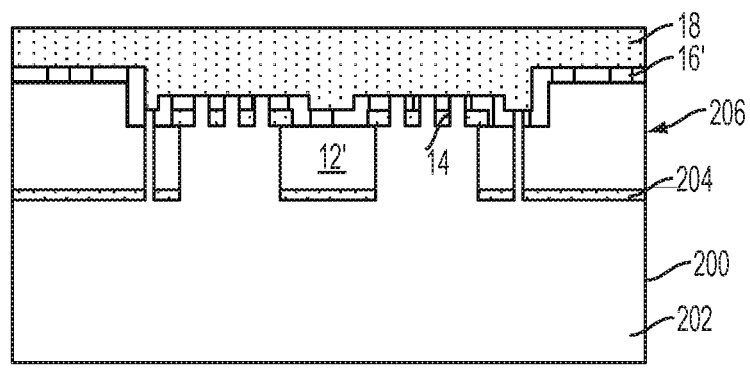
Figure 2D:
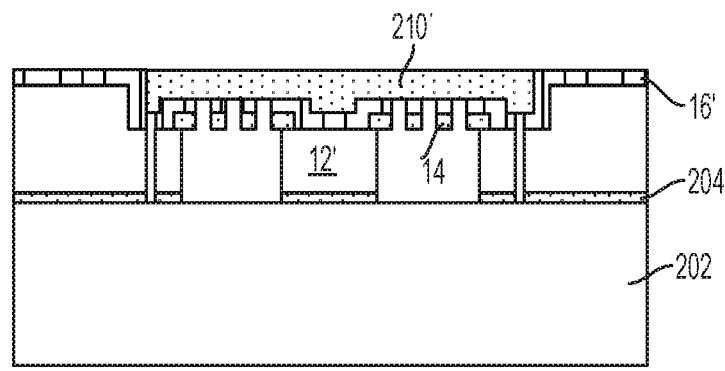

In FIG. 2B, the MEMS substrate 206 is shown bonded with the handle wafer 200 at the oxide layer 204. Fusion bonding is an exemplary bonding method in FIG. 2B. Analogous to FIGS. 1J and 1K, the temporary wafer handle 20 is removed, in FIG. 2C. In FIG. 2D, patterning is performed. That is, a blanket oxide etching is performed to form the oxide 210', which serves as a support structure for the MEMS device.

Figure 2E:
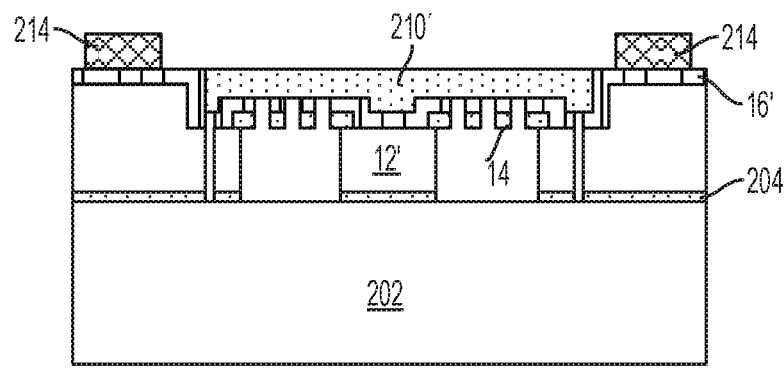
Figure 2F:
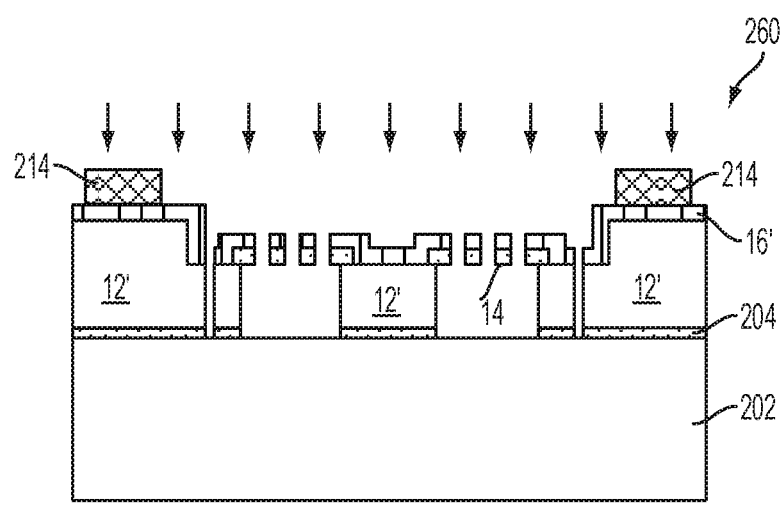

In FIG. 2E, a conductive layer 214 is formed on top of polysilicon 16' where the oxide 210' is not present. Examples of this conductive layer include germanium, tin, gold, and aluminum among other suitable material. Next, as shown in FIG. 2F, oxide etching is performed through the polysilicon and silicon wafer, stopping at oxide. In an exemplary method, reactive ion etching (RIE) is used as the etching process.

Figure 2G:
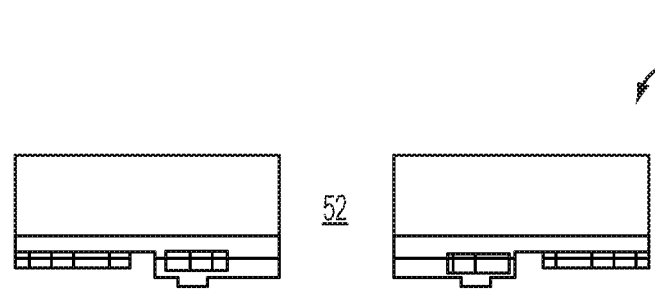
Figure 2H:
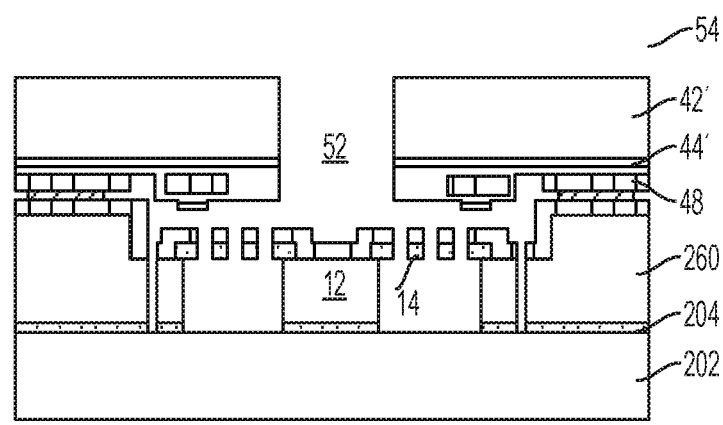
Figure 2I:
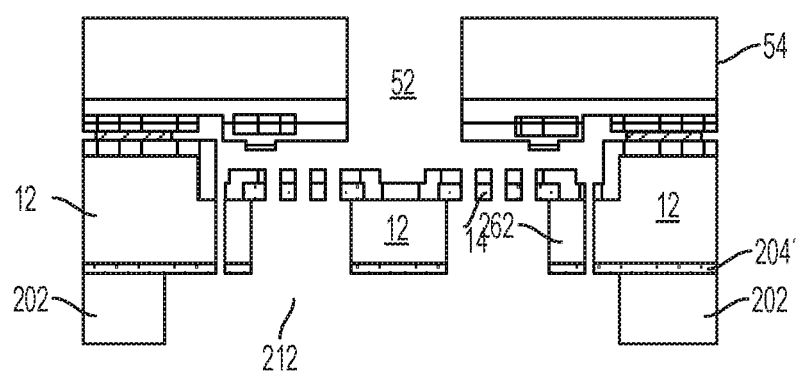
Figure 2J:
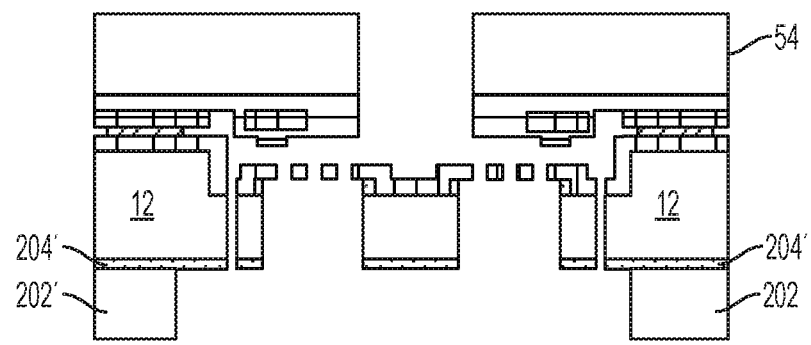

FIG. 2G shows the CMOS wafer 54. In FIG. 2H, the MEMS substrate 260 is bonded to the CMOS wafer 54 using a suitable bonding technique. As with all methods disclosed herein and contemplated exemplary bonding techniques include fusion bonding or Eutectic bonding. The structure of FIG. 2H is ground and in FIG. 2I, the handle wafer is patterned and etched stopping at the oxide 204 to form the port 212. In FIG. 2J, etching is performed to remove the silicon oxide 14 to form the MEMS device 270. Exemplary etching processes include RIE or HF.

Figure 2K:
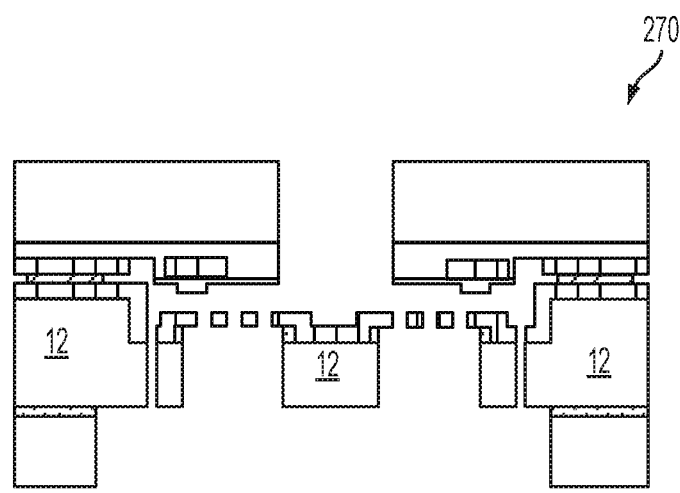
Figure 2L:
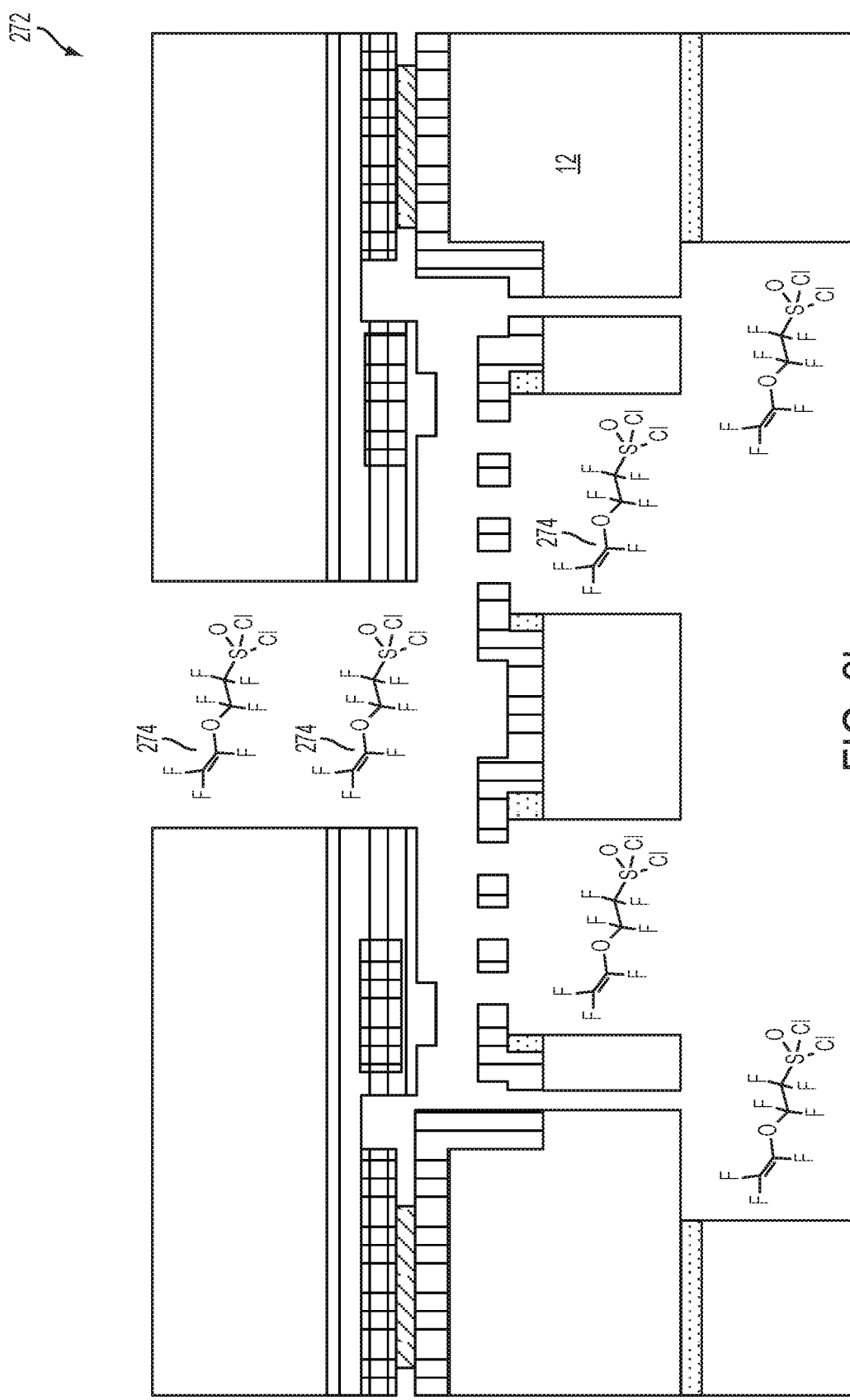

In FIG. 2K, tab dicing is performed while both sides (top and bottom) of the MEMS device are protected by tape. In FIG. 2L a coating is applied to the MEMS device 272 analogous to that of FIG. 1S.

Figure 3A:
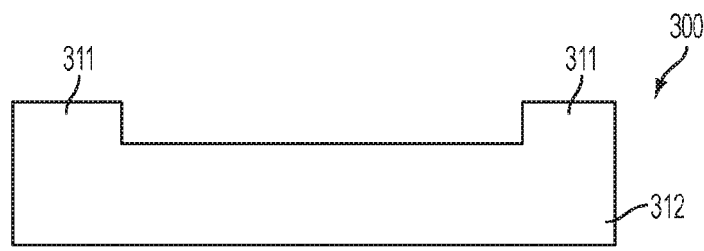
FIGS. 3A-3O show a process of fabricating a MEMS device, in accordance with yet another method of the invention.

FIGS. 3A-3O show a process of fabricating a MEMS device, in accordance with yet another method of the invention. In this process, no temporary wafer handle need be employed and the CMOS wafer is directly bonded to the MEMS substrate.

Figure 3B:
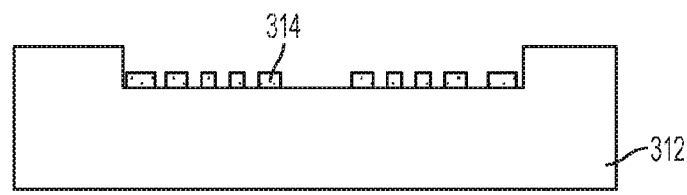
Figure 3C:
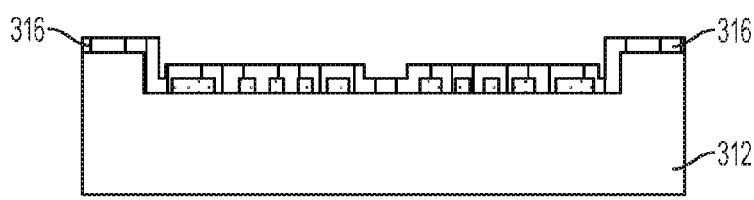
Figure 3D:
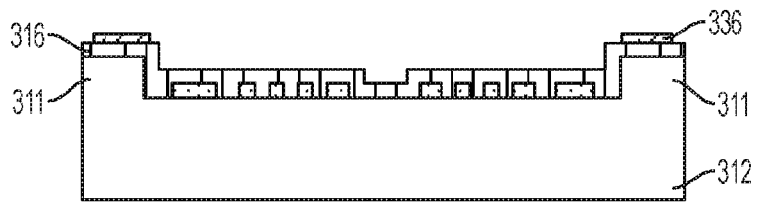
Figure 3E:
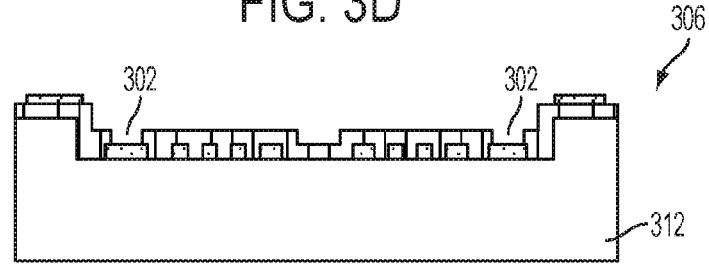

FIG. 3A shows a silicon wafer 300 with the silicon wafer 312 having standoffs 311 etched therein. In FIG. 3B, oxide 314 is deposited and partially etched as shown. In FIG. 3C, polysilicon 316 is deposited over the standoffs 311 and oxide 314 and the silicon wafer 312. Next, in FIG. 3D, a conductive layer 336 is formed on top of the polysilicon 316 in areas above the standoffs 311. This is a deviation from the processes shown and described above in that no temporary handle wafer is formed. In FIG. 3E, the polysilicon 316 is patterned leaving space regions 302. The MEMS substrate 306 is accordingly formed.

Figure 3F:
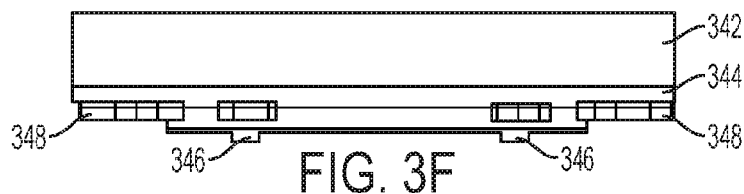

FIG. 3F shows a CMOS wafer 340 similar to that of FIG. 1O with bump stops 346 shown protruding from the CMOS dielectric 344. In some embodiments, the bump stops of the various embodiments of the invention are made of silicon nitride, silicon oxide, or a combination of both. Other CMOS compatible materials such as titanium nitride and aluminum may also be used independently or in conjunction with the silicon nitride and silicon oxide. The CMOS wafer 340 is also shown to have a CMOS substrate 342 and a metal layer 348 disposed in the CMOS dielectric 344.

Figure 3G:
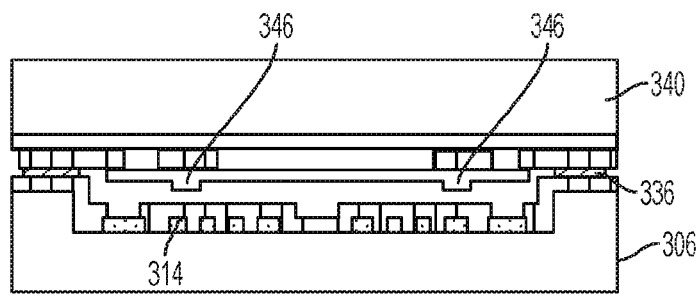

In FIG. 3G, the CMOS wafer 340 is shown bonded to the MEMS substrate 306 and the MEMS substrate 306 is ground and polished. In an exemplary method, Eutectic aluminum-germanium bonding is employed. Accordingly, the MEMS substrate is bonded to the CMOS wafer and the CMOS wafer acts as the support layer. That is, the CMOS wafer is the back-support layer.

Figure 3H:
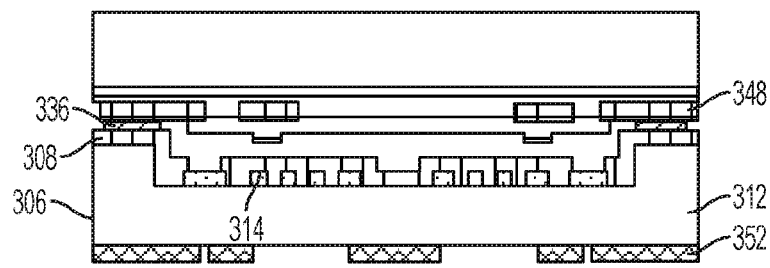
Figure 3I:
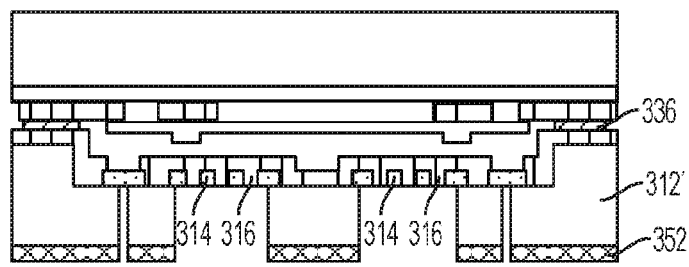
Figure 3J:
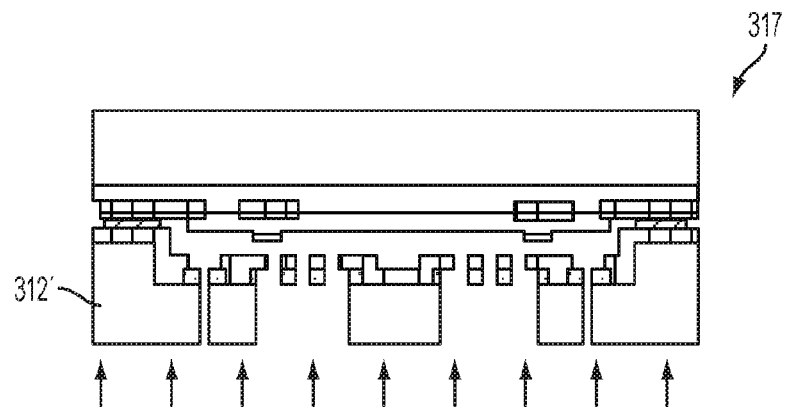
Figure 3K:
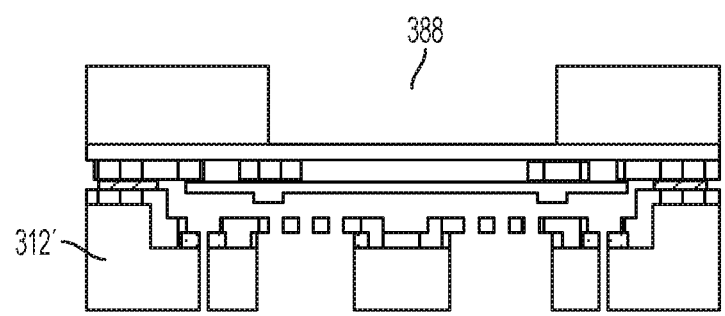
Figure 3L:
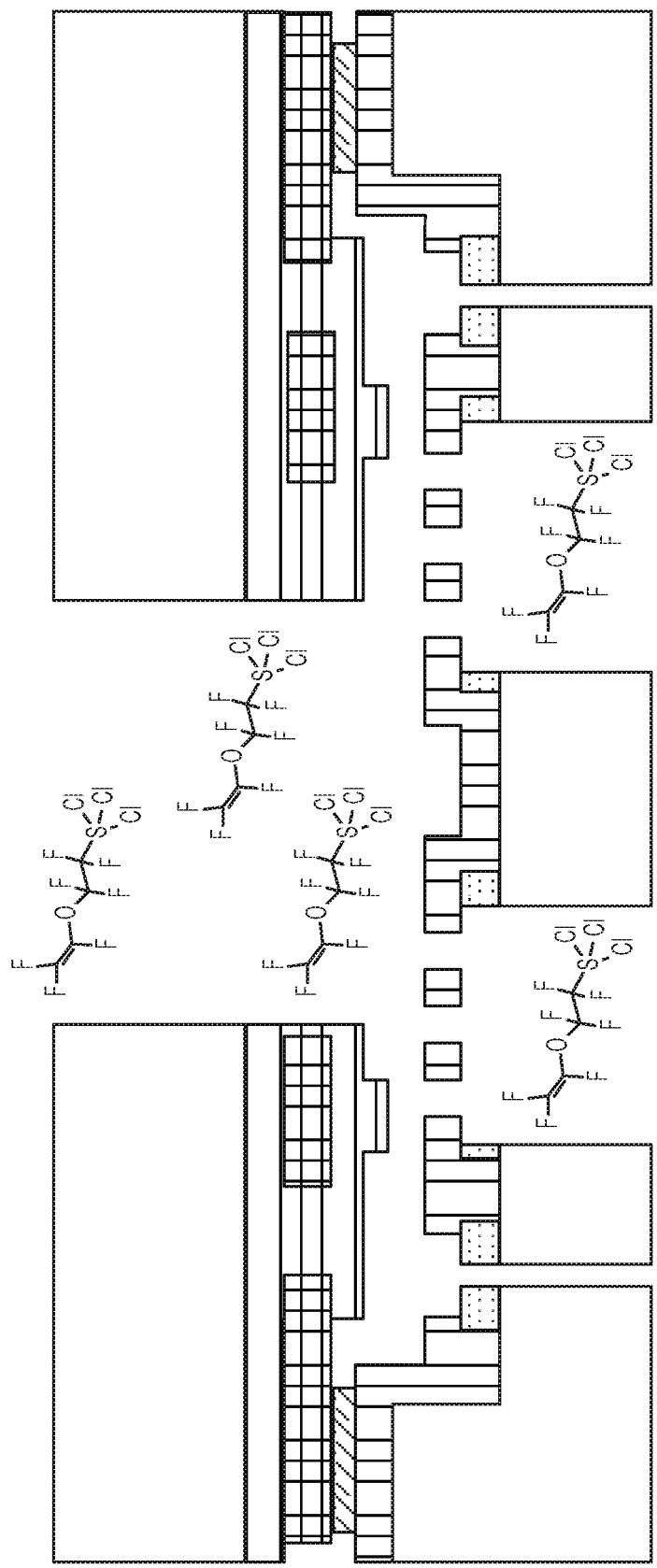

In FIG. 3H, a photoresist layer 352 is added using photolithography and at FIG. 3I, etching is performed and etching through the silicon wafer 312 and stopping at oxide 314, as previously discussed relative to other figures. An exemplary method of etching is DRIE. In FIG. 3J, the photoresist 352 and polysilicon 316 are etched in a direction shown by the arrows to form the MEMS substrate 317. In an exemplary method, RIE is employed as the method of etching. From this step to when SAM coating is applied, the MEMS device may be formed using two options. One option is to form an open cavity or port, which is suitable for microphone applications, and another option, is to build a closed cavity MEMS device. FIGS. 3K and 3L show the open cavity option and FIGS. 3M-3O show the closed cavity option.

In FIG. 3K, the CMOS wafer is ground and a port 388 is etched, such as an acoustic port, and in FIG. 3L SAM coating is applied. Alternatively, step 3K is performed prior to the bonding step of FIG. 3G.

Figure 3M:
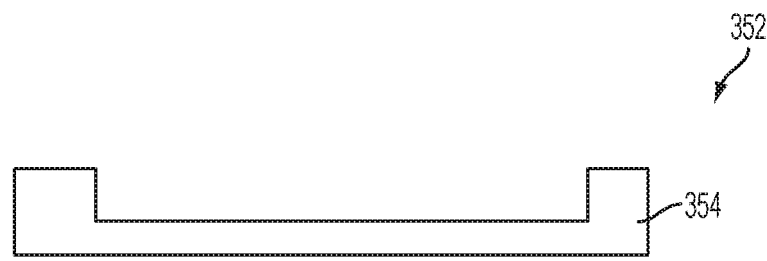
Figure 3N:
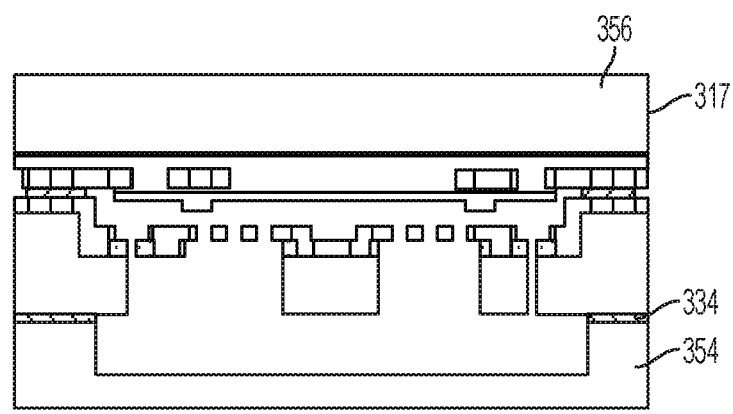
Figure 30:
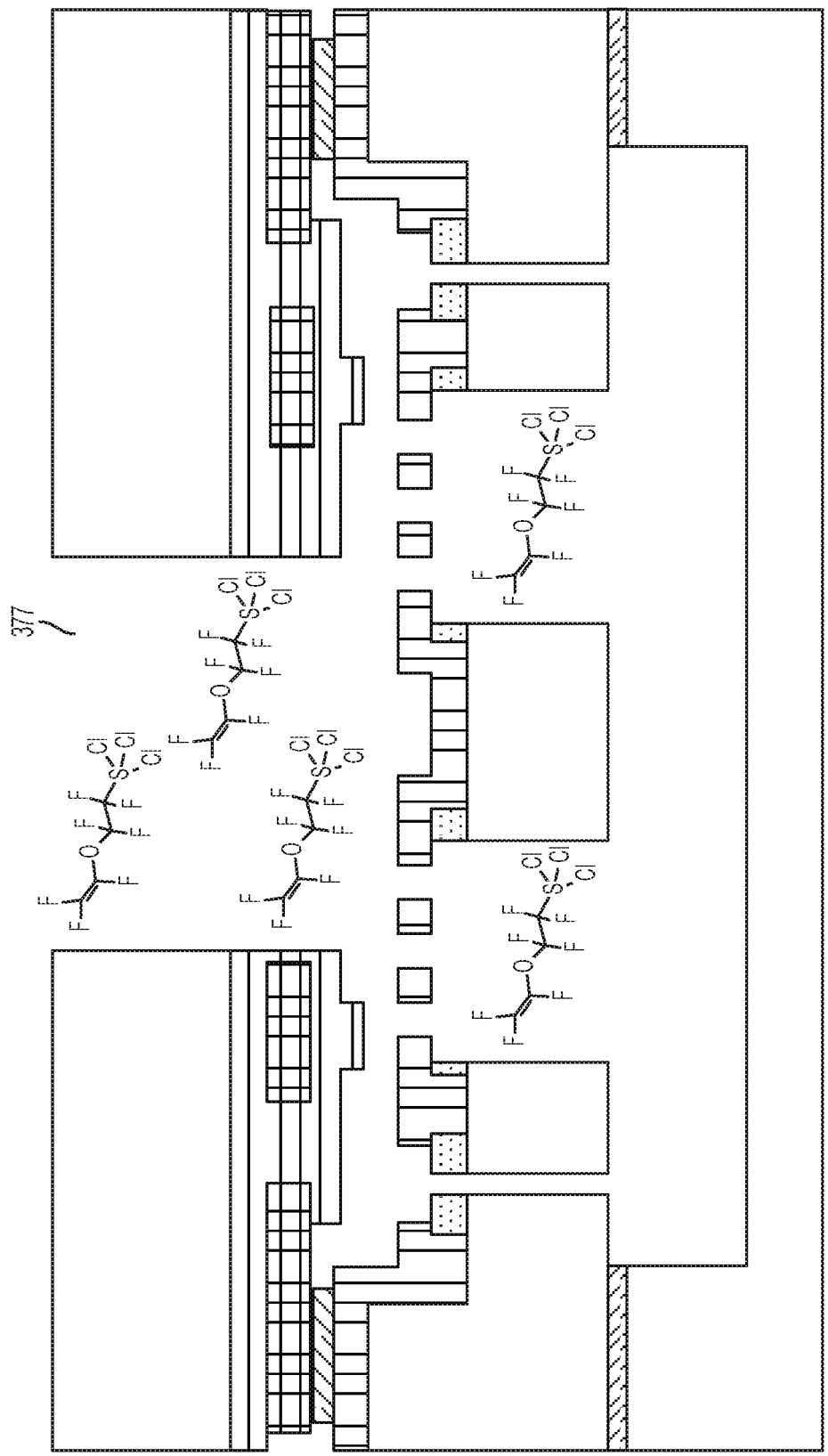

In FIG. 3M, a cap layer 354 is shown that is also referred to herein as a handle wafer. In FIG. 3N, the handle wafer 354 is bonded to the MEMS substrate 317. In an exemplary method, titanium is deposited on handle wafer 354 to form a titanium silicon bond 334.

In FIG. 3O, the CMOS wafer is ground, a port 377 is etched and tab dicing and SAM coating is performed, as discussed hereinabove relative to previous figures.

Figure 4A:
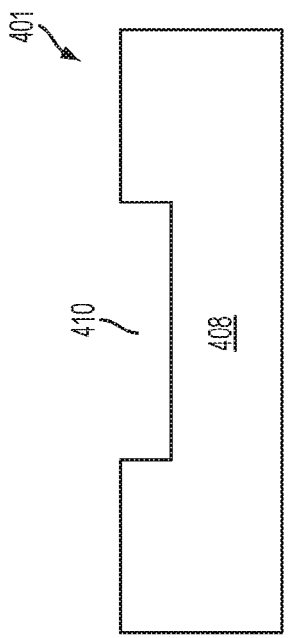
FIGS. 4A-4I show a process of fabricating a MEMS device, in accordance with still another method of the invention.
Figure 4B:
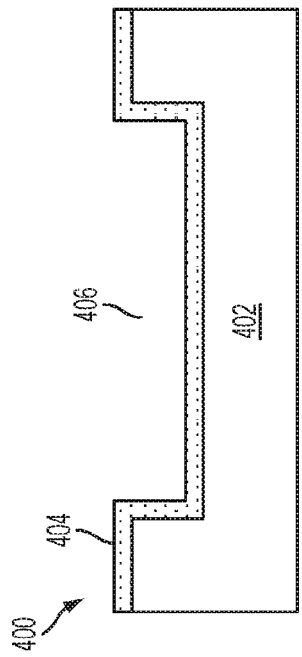
Figure 4C:
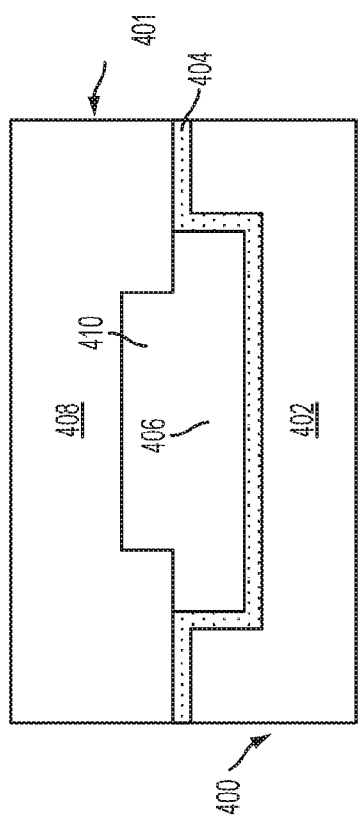

FIGS. 4A-4I show a process of fabricating a MEMS device, in accordance with still another method of the invention. In FIG. 4A, the handle wafer 400 is shown to include a silicon wafer 402 on top of which is deposited silicon oxide 404 into which a cavity 406 is partially etched. FIG. 4B shows a device wafer (or MEMS substrate) 401 with a silicon wafer 408 into which a cavity 410 is partially etched. In FIG. 4C, the handle wafer 400 is aligned and bonded with the device wafer 401 such that the cavities 406 and 410 line up. In an exemplary method, fusion bonding or Eutectic bonding is employed.

Figure 4D:
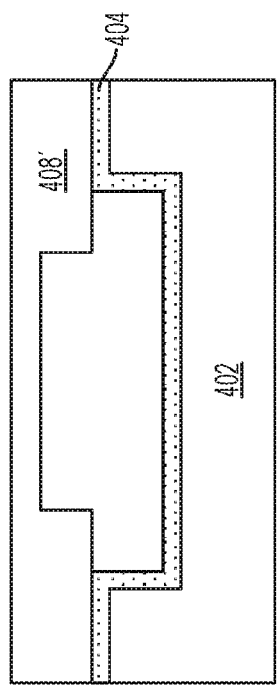
Figure 4E:
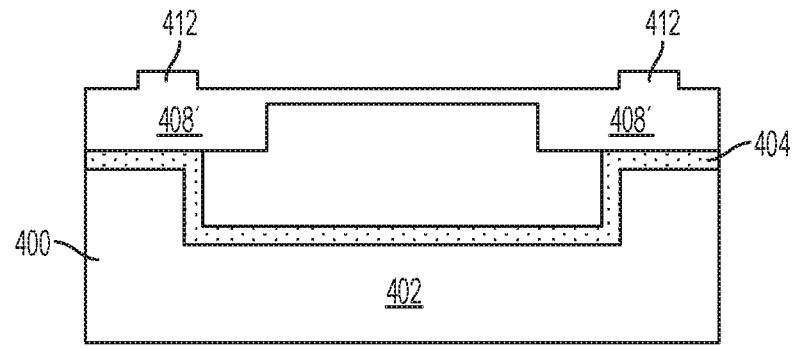
Figure 4F:
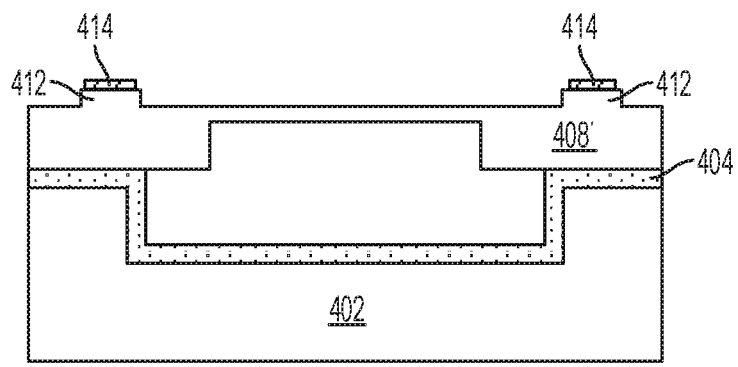
Figure 4G:
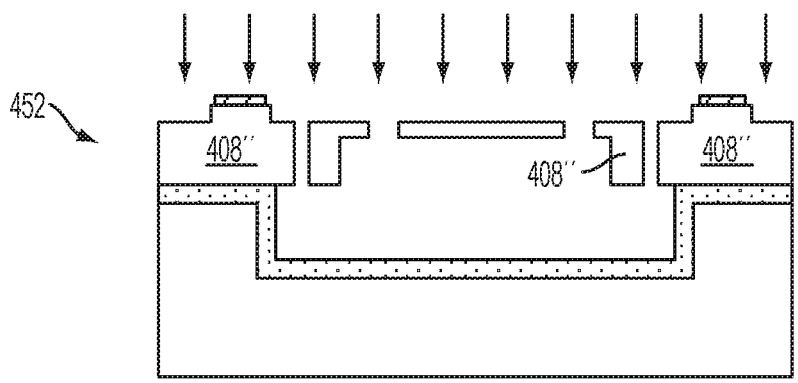

In FIG. 4D, thinning is performed to thin the silicon wafer 408 forming silicon wafer 408' by grinding and polishing the wafer 408. In FIG. 4E, standoffs 412 are etched into the silicon wafer 408'. Next, as shown in FIG. 4F, a conductive layer 414, such as but not limited to germanium, is deposited on top of the standoffs 412, patterned and etched. In FIG. 4G, the MEMS structure is patterned by etching the structure shown in FIG. 4G to form the patterned MEMS structure 408'' and the MEMS substrate 452. Exemplary etching techniques disclosed above can be employed.

Figure 4H:
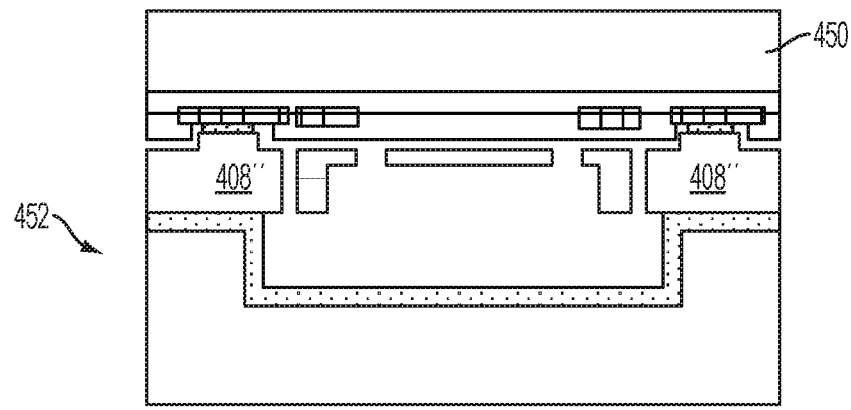
Figure 4I:
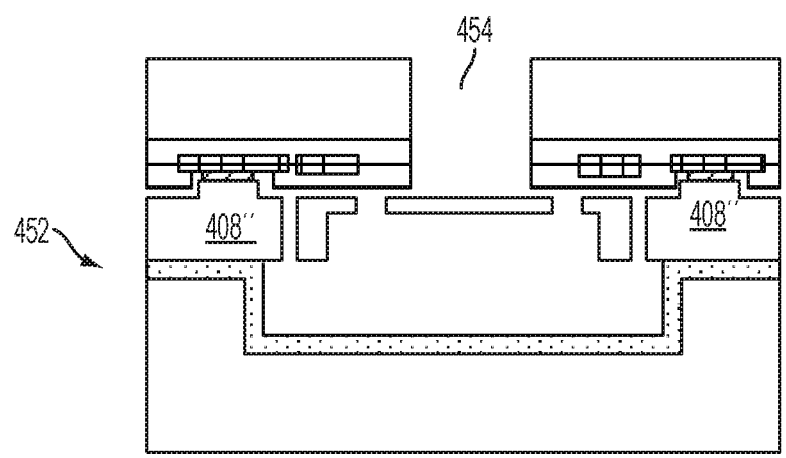

In FIG. 4H, the MEMS substrate 452 is bonded to a CMOS wafer 450, as discussed relative to previous figures. In an embodiment, CMOS wafer 450 is similar to CMOS wafer 340. In FIG. 4L, for microphone applications, a port 454 is etched through CMOS wafer 450.

Figure 5A:
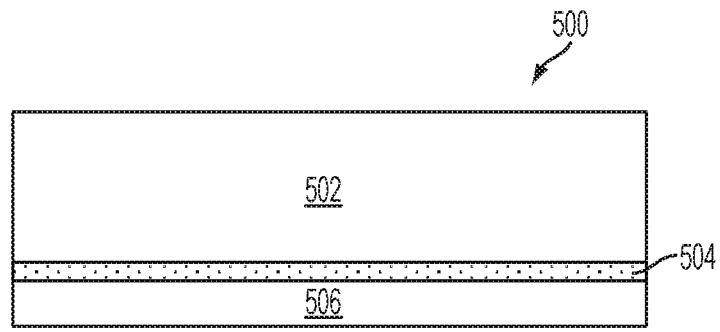
FIGS. 5A-5H show a process of fabricating a MEMS device, in accordance with another method of the invention.
Figure 5B:
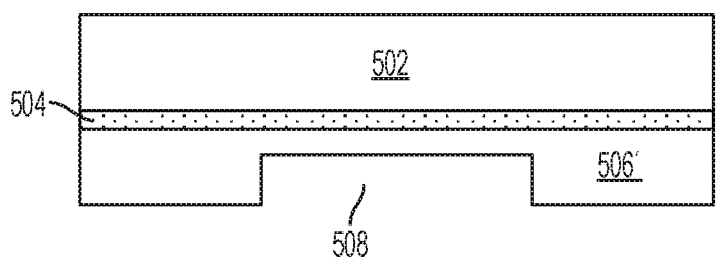
Figure 5C:
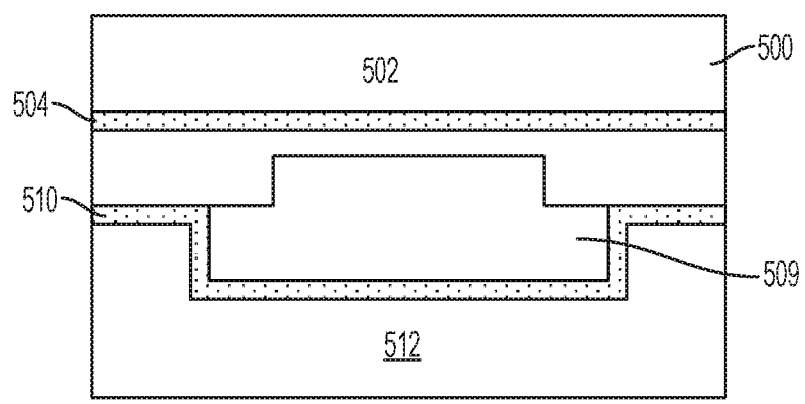

FIGS. 5A-5H show a process of fabricating a MEMS device, in accordance with another method of the invention. In FIG. 5A, a silicon-on-insulator (SOI) wafer 500 is shown to include a single-crystal silicon 506, silicon oxide 504, and silicon substrate 502. The silicon substrate 502 and silicon oxide 504 are essentially the handle wafer. In FIG. 5B, a cavity 508 is etched into the single-crystal silicon 506 to form the single-crystal silicon 506'. Next, in FIG. 5C, the wafer 500 is bonded to a MEMS substrate including silicon oxide 510 and silicon substrate 512, silicon substrate 512 having a cavity 509. In accordance with an exemplary method of the invention, fusion bonding is employed.

Figure 5D:
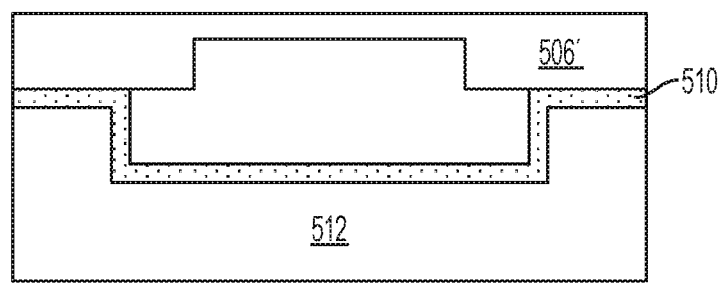
Figure 5E:
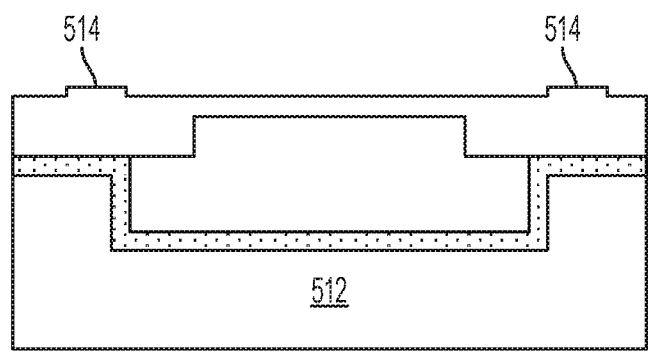
Figure 5F:
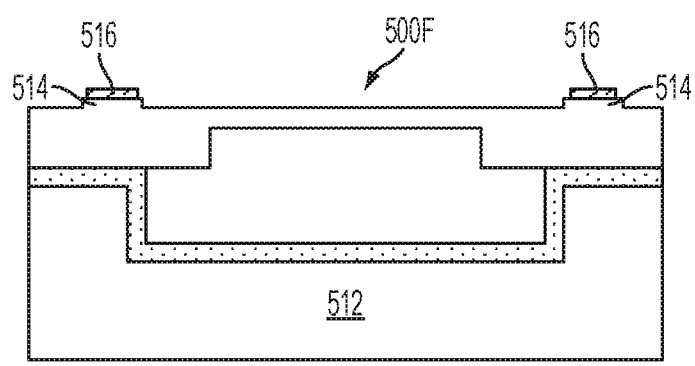
Figure 5G:
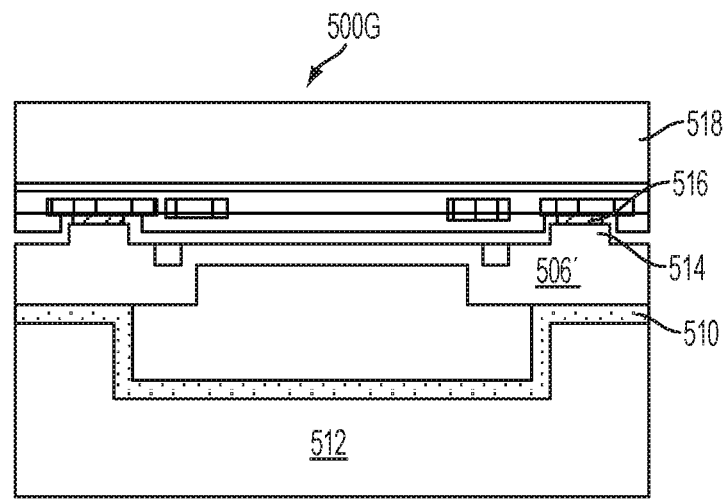
Figure 5H:
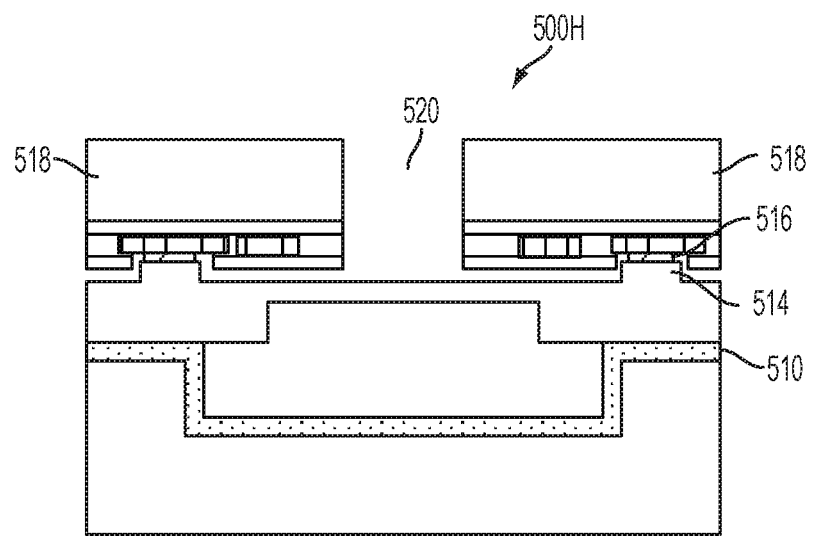

Next, in FIG. 5D, the handle wafer is removed, using any combination of grinding, etching, or de-bonding, leaving the single-crystal silicon 506'. In FIG. 5E, standoffs 514 are formed on the single-crystal silicon 506' at either edge and as shown in FIG. 5F, a conductive layer 516, such as germanium, is deposited on the standoffs 514. In FIG. 5G, a CMOS wafer 518, similar to the CMOS wafer 40 of FIG. 1O, is bonded to the structure 500F of FIG. 5F resulting in structure 500G. A port 520 is shown etched in the CMOS wafer 518 for acoustic applications. An advantage of the method of FIGS. 5A to 5H is that the single-crystal silicon 506 has a thickness that is well defined, wherein the thickness variation is low and well controlled.

Figure 6A:
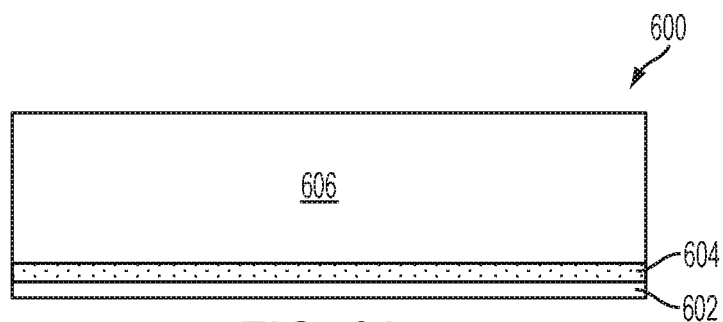
FIGS. 6A-6J show a process of fabricating a MEMS device, in accordance with another method of the invention.
Figure 6B:
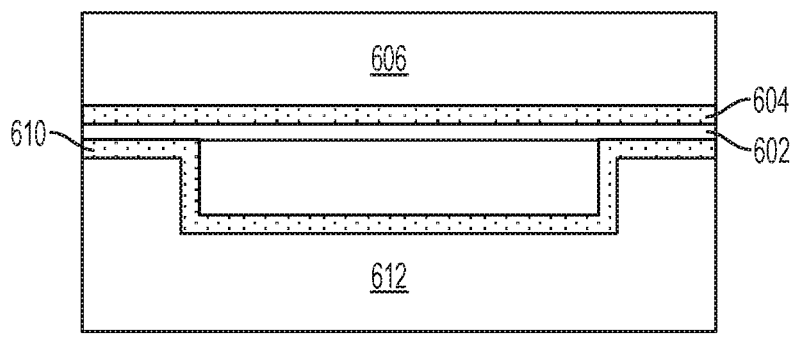
Figure 6C:
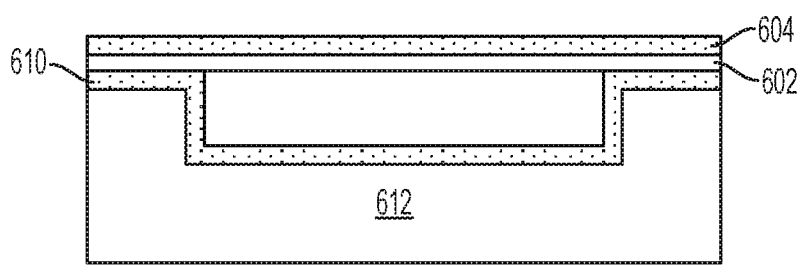
Figure 6D:
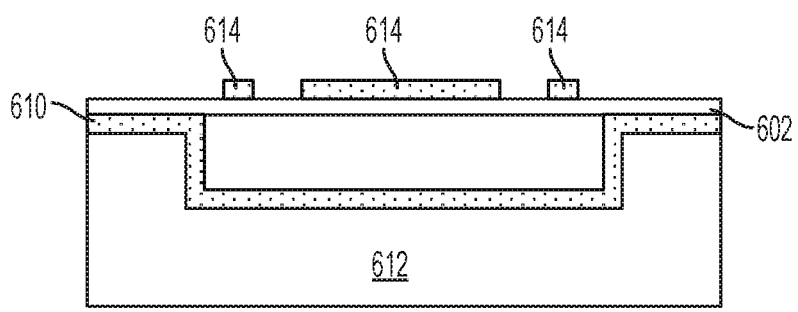
Figure 6E:
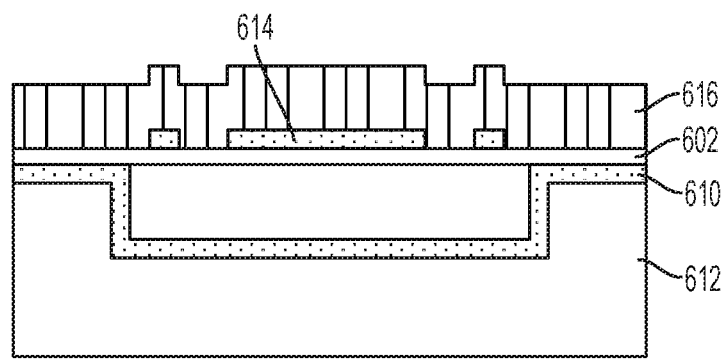
Figure 6F:
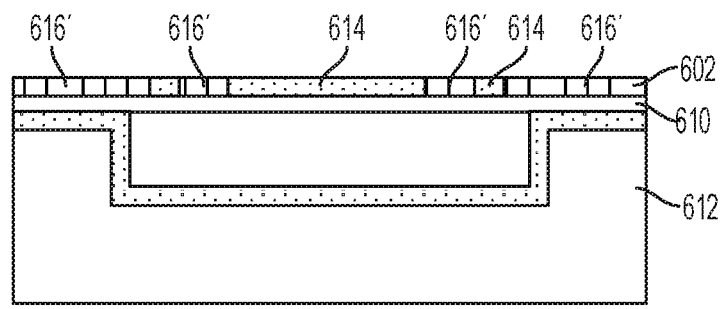
Figure 6G:
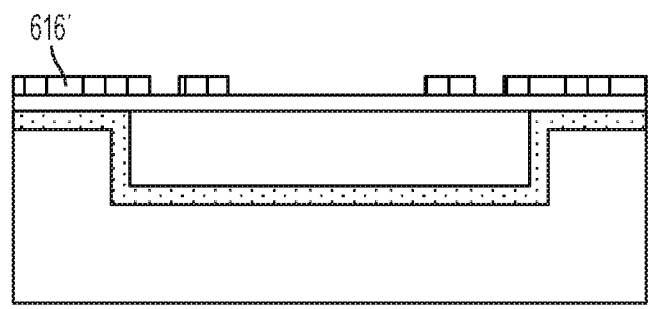
Figure 6H:
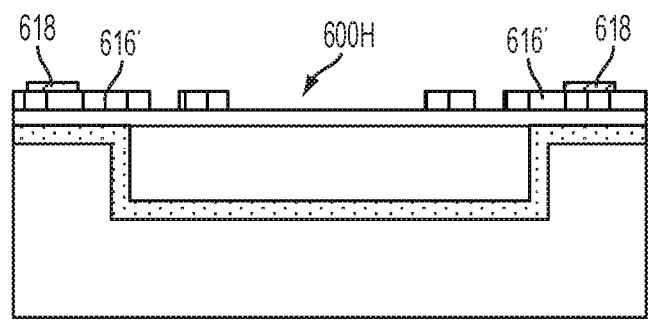
Figure 6I:
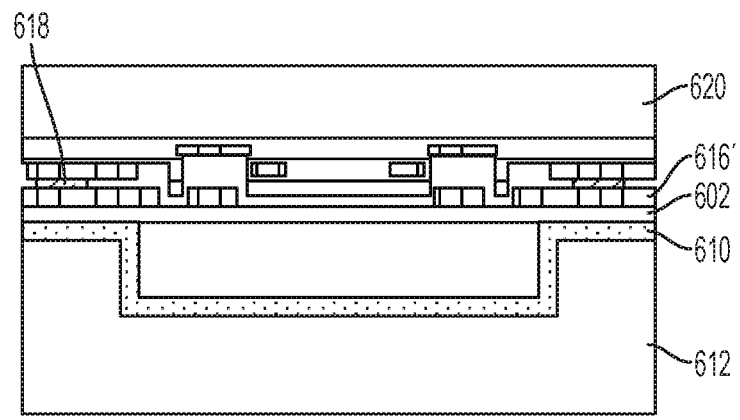
Figure 6J:
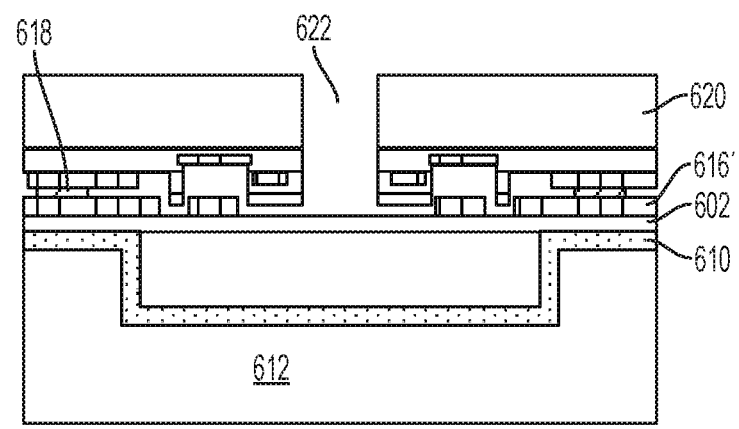

FIGS. 6A-6J show a process of fabricating a MEMS device, in accordance with another method of the invention. The process of FIGS. 6A and 6B is analogous to that of FIGS. 5A-5C except that no cavity is created in the single-crystal silicon 602 of the SOI wafer 600. As in the method of FIGS. 5A-5H, the single-crystal silicon 602 thickness is advantageously well defined. As shown in FIG. 6B, the handle wafer 600 is bonded with the MEMS substrate including silicon oxide 610 and silicon substrate 612 with a cavity XXX formed in silicon substrate 612. In FIG. 6C, the silicon substrate 606 is shown to be removed and in FIG. 6D, the silicon oxide 604 is etched using photolithography, creating the silicon oxide 614. In FIG. 6E, epi-silicon or polysilicon 616 is shown deposited on top of the oxide 614 as well as the single-crystal silicon 602. In FIG. 6F, CMP is performed stopping at the oxide 614 to form the polysilicon 616'. In FIG. 6G, the oxide 614 is etched. In FIG. 6H, the conductive layer 618, such as germanium, is shown formed on top of the polysilicon 616'. In FIG. 6I, the CMOS wafer 620 is shown bonded with the structure 600H shown in FIG. 6H and in FIG. 6J, the port 622 is shown formed in and through the CMOS wafer 620.

Figure 7A:
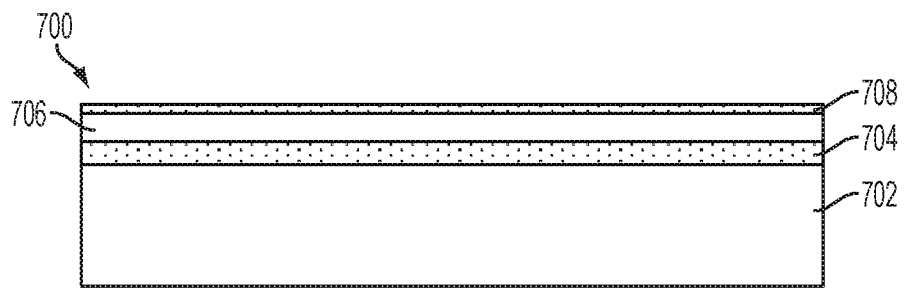
FIGS. 7A-7K show a process of fabricating a MEMS device, in accordance with another method of the invention.

FIGS. 7A-7K show a process of fabricating a MEMS device, in accordance with another method of the invention. FIG. 7A shows a MEMS substrate 700 including a SOI structure with a thin buffer oxide. The MEMS substrate 700 is shown to include a single crystal silicon 702 on top of which is formed silicon oxide 704 on top of which is formed a second single crystal silicon 706 on top of which is formed a thin oxide layer 708. The oxide layer 708 functions as a thin buffer oxide. In an embodiment of the invention, the layer 708 is approximately 100 nanometers (nm).

Figure 7B:
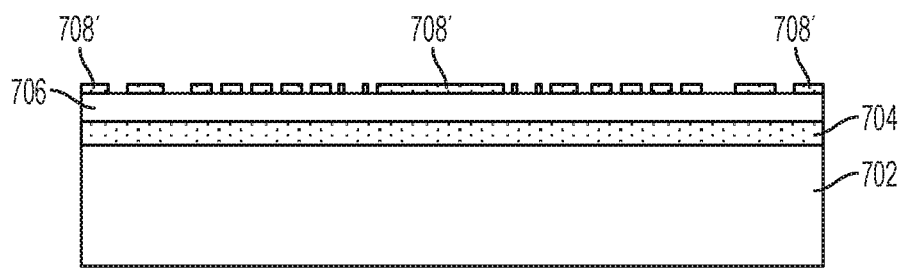
Figure 7C:
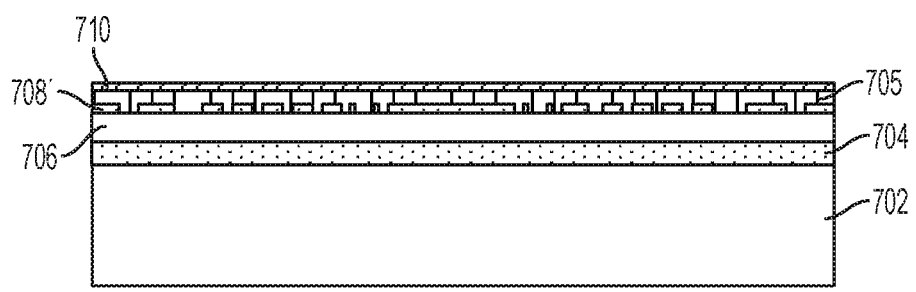

In FIG. 7B, the oxide 708 is patterned and etched to form the oxide 708'. In FIG. 7C, a layer of polysilicon 705 is deposited over the oxide layer 708'. A conductive layer 710 is formed on top of polysilicon 705. In an embodiment of the invention, the conductive layer 710 is made of germanium or other materials indicated with respect to the embodiments of FIGS. 1A-1S.

Figure 7D:
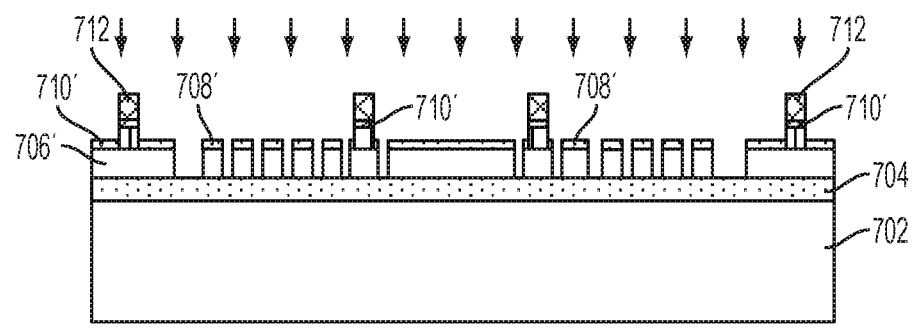
Figure 7E:
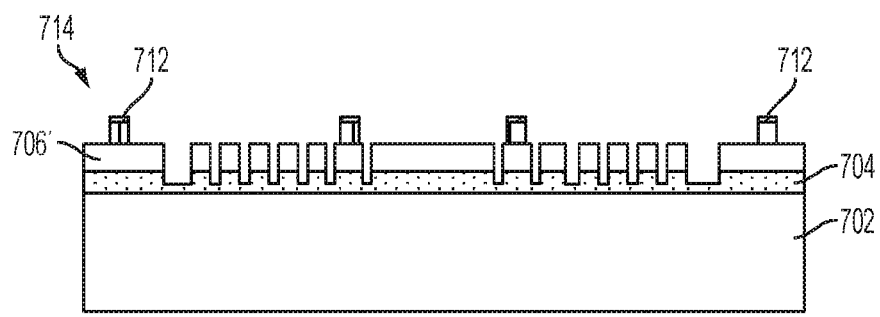
Figure 7F:
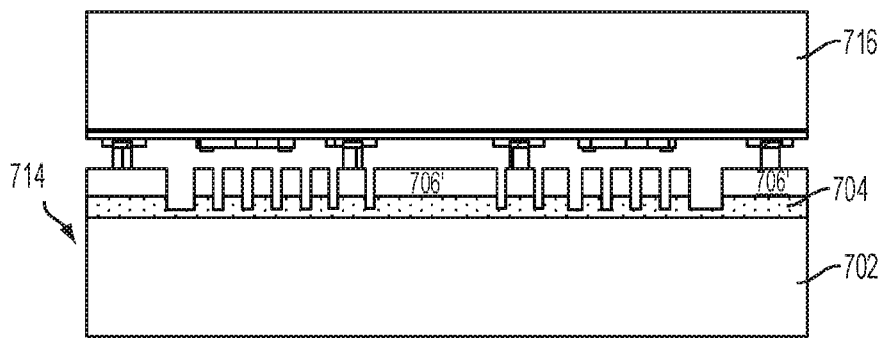
Figure 7G:
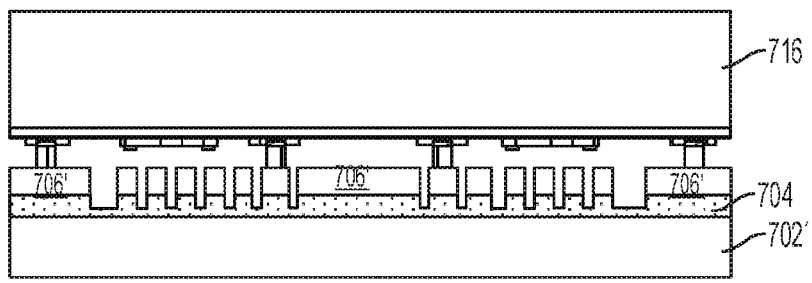

In FIG. 7D, standoffs 712 are patterned and the structure is etched through to the silicon oxide 704 to form patterned second single crystal silicon 706' and patterned conductive layer 710'. In FIG. 7E, partial oxide etching is performed to etch the oxide 708'. Accordingly, the MEMS substrate 714 is formed. In FIG. 7F, the CMOS wafer 716, similar to CMOS wafer 340, is bonded to the MEMS substrate 714. In an exemplary method, the Eutectic bonding.

Figure 7H:
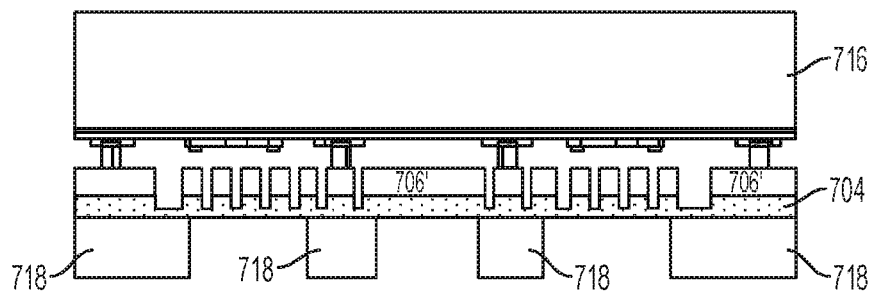
Figure 7I:
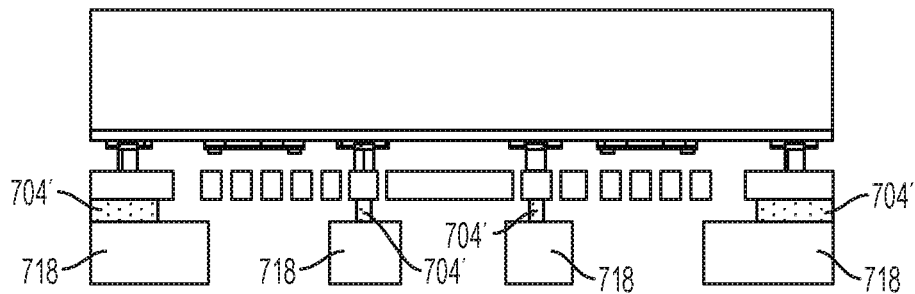
Figure 7J:
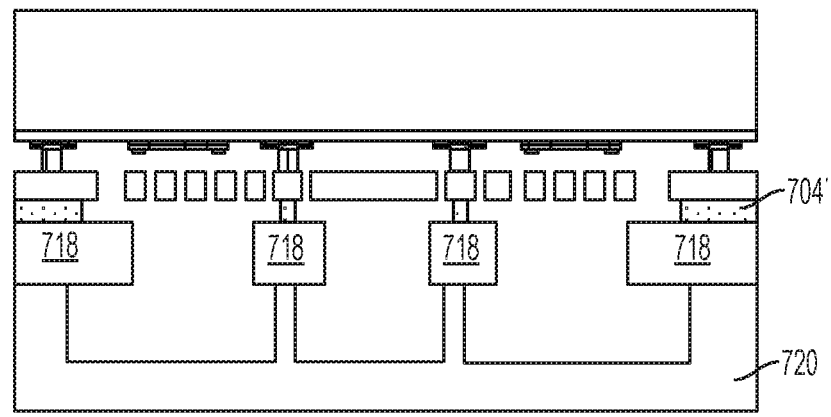
Figure 7K:
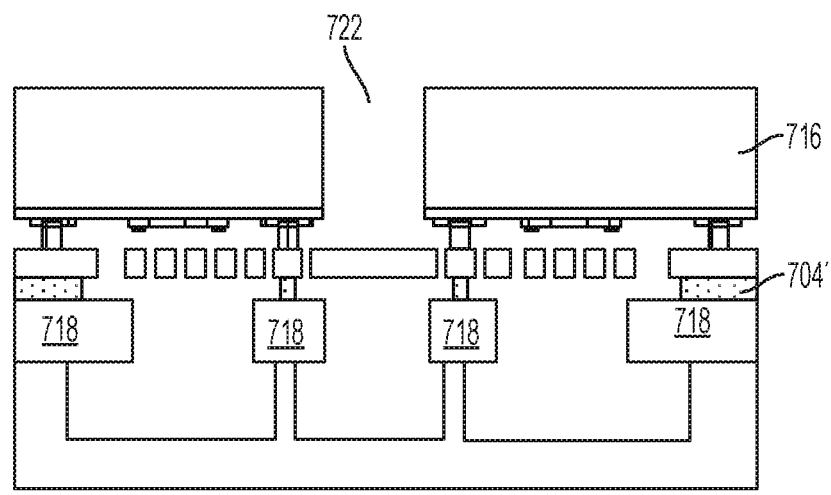

In 7G, grinding and polishing is performed making the single crystal silicon 702 thinner to form the single crystal silicon 702'. In FIG. 7H, the single crystal silicon 702' is etched forming an extended pressure equalization channel and bump stops 718. In FIG. 7I, the silicon oxide 704 is partially etched to form the etched silicon oxide 704'. In an exemplary method, the partial etching is performed by vapor phase hydrofluoric acid etching. Optionally, the step of FIG. 7I may be performed after the port is etched. In FIG. 7J, a handle wafer 720, similar to 354, is bonded to the structure of FIG. 7I or 7H, as the case may be. A couple of options are presented, one option being to bond to the handle wafer with a cavity and the other option is to bond to a non-patterned temporary handle for use with external back cavity. In FIG. 7K, grinding and polishing of the CMOS substrate 716 is performed. Additionally a port 722 is etched and in the case of extended back cavity, the temporary wafer handle is removed.

Applications of the various embodiments and methods shown and described herein include but are not limited to microphones, pressure sensors, resonators, switches, and other applicable devices.

Although the description has been described with respect to particular embodiments thereof, these particular embodiments are merely illustrative, and not restrictive.

As used in the description herein and throughout the claims that follow, "a", "an", and "the" includes plural references unless the context clearly dictates otherwise.

Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What we claim is:

1. A method for fabricating a MEMS device comprising:
    forming a first silicon wafer with a first cavity;
    after forming the forming the first silicon wafer, forming a first oxide layer lining the first cavity;
    forming a second silicon wafer, the second silicon wafer comprising a handle wafer, a device wafer, and oxide disposed between the second silicon wafer and the handle wafer;
    bonding the first silicon wafer to the second silicon wafer;
    depositing a second oxide layer on top of the second silicon wafer;
    removing the handle wafer of the second silicon wafer leaving the second oxide layer on the second silicon wafer;
    patterning the second oxide layer;
    depositing a polysilicon layer on the patterned second oxide layer;
    planarizing the polysilicon layer and stopping the planarizing at the second oxide layer;
    removing the second oxide layer;
    depositing and patterning a conductive layer; and
    bonding the second silicon wafer with an electrical connection.

2. The method for fabricating a MEMS device, as recited in claim 1, further including opening a port in the second silicon wafer.

3. The method for fabricating a MEMS device, as recited in claim 1, further including opening a port in the first silicon wafer.

4. The method for fabricating a MEMS device, as recited in claim 1, wherein the second silicon layer includes a dielectric layer and forming cavities in the dielectric layer.

5. The method for fabricating a MEMS device, as recited in claim 1, wherein the second silicon wafer is a CMOS layer.

6. A method for fabricating a MEMS device comprising:
    forming a silicon-on-insulator (SOI) wafer with a cavity, the SOI wafer comprising a handle layer, a device layer and oxide formed between the handle layer and the device layer;
    depositing a first oxide layer on the SOI wafer and patterning the deposited first oxide layer;
    after depositing the first oxide layer, depositing a second oxide layer on top of the cavity thereby lining the cavity with the oxide layer;
    depositing polysilicon on the patterned first oxide layer;
    depositing a conductive layer on the polysilicon;
    patterning and etching the polysilicon and the conductive layer;
    further etching the device layer;
    removing the patterned first oxide layer thereby forming a MEMS substrate;
    bonding the MEMS substrate to the CMOS wafer, the CMOS wafer having at least one metal layer;

forming an electrical connection between the MEMS substrate and the at least one metal layer;

thinning the handle layer;

patterning the handle layer; and removing the first oxide layer deposited on the SOI wafer.

7. The method for fabricating a MEMS device, as recited in claim 6, further including bonding the MEMS substrate to a silicon cap wafer with cavities.

8. The method for fabricating a MEMS device, as recited in claim 7, further including an opening port in the silicon cap wafer.

9. The method for fabricating a MEMS device, as recited in claim 6, further including opening a port in the CMOS wafer.

* * * * *